United States Patent
Nagai et al.

(10) Patent No.: US 7,433,907 B2
(45) Date of Patent: Oct. 7, 2008

(54) SIGNAL ANALYZING METHOD, SIGNAL SYNTHESIZING METHOD OF COMPLEX EXPONENTIAL MODULATION FILTER BANK, PROGRAM THEREOF AND RECORDING MEDIUM THEREOF

(75) Inventors: Kiyotaka Nagai, Nishinomiya (JP); Hikaru Usami, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 796 days.

(21) Appl. No.: 10/986,624

(22) Filed: Nov. 12, 2004

(65) Prior Publication Data

US 2005/0108002 A1 May 19, 2005

(30) Foreign Application Priority Data

Nov. 13, 2003 (JP) ............................. 2003-383535

(51) Int. Cl.
*G06F 17/10* (2006.01)
(52) U.S. Cl. ..................................................... 708/300
(58) Field of Classification Search .................. 708/300
See application file for complete search history.

(56) References Cited

U.S. PATENT DOCUMENTS

| | | | | |
|---|---|---|---|---|
| 6,690,717 B1* | 2/2004 | Kim et al. | ................ | 375/219 |
| 6,856,653 B1* | 2/2005 | Taniguchi et al. | ........... | 375/285 |
| 6,952,446 B1* | 10/2005 | Tsui et al. | .................... | 375/232 |
| 7,043,512 B2* | 5/2006 | Lee et al. | ..................... | 708/300 |
| 7,290,021 B2* | 10/2007 | Gray | .......................... | 708/300 |
| 2004/0042557 A1* | 3/2004 | Kabel et al. | ................. | 375/260 |

FOREIGN PATENT DOCUMENTS

WO    WO 02/080362 A1    10/2002

OTHER PUBLICATIONS

ISO/IEC 14496-3: 2001, Information technology—Coding of audio-visual objects—Part 3: Audio, ISO/IEC JTC1/SC29/WG11/N5570, Mar. 2003 (Text of ISO/IEC 14496-3:2001/FDAM1, Bandwidth Extension).

* cited by examiner

*Primary Examiner*—David H Malzahn
(74) *Attorney, Agent, or Firm*—RatnerPrestia

(57) ABSTRACT

Provided is a complex exponential modulation filter bank which can reduce quantity of arithmetic operation, and can realize low electric power consumption or speeding-up. This complex exponential modulation filter bank has a step of calculating a first intermediate signal from an input signal, a step of calculating a second intermediate signal from the first intermediate signal, a step of calculating a third intermediate signal from the second intermediate signal with fast Fourier transform, and a step of calculating a complex band output signal from the third intermediate signal.

12 Claims, 13 Drawing Sheets

FIG. 13

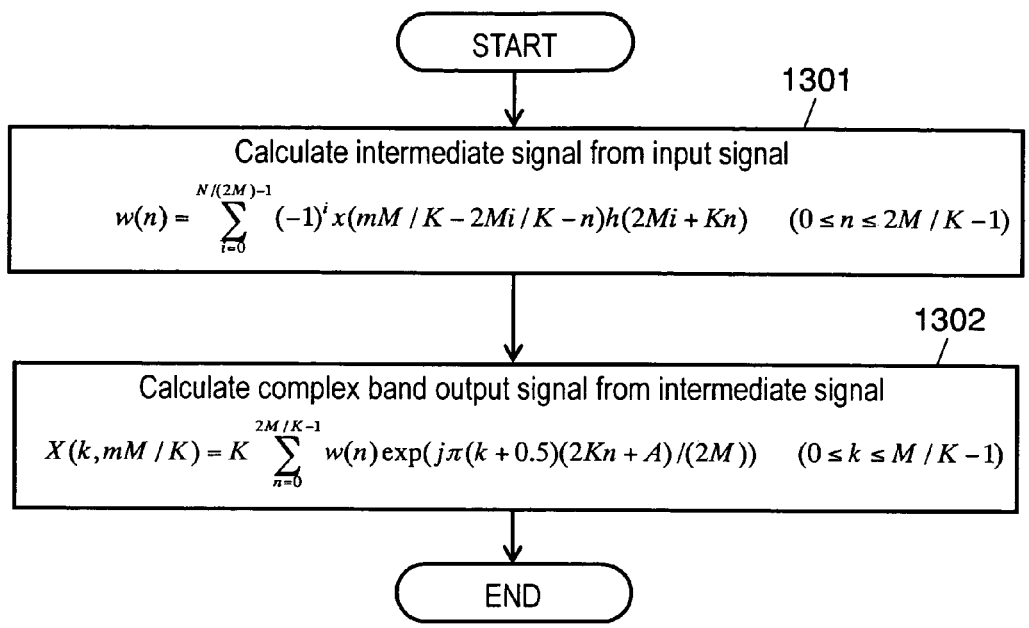

START → 1301 Calculate intermediate signal from input signal $$w(n) = \sum_{i=0}^{N/(2M)-1} (-1)^i x(mM/K - 2Mi/K - n)h(2Mi + Kn) \quad (0 \le n \le 2M/K - 1)$$

→ 1302 Calculate complex band output signal from intermediate signal $$X(k, mM/K) = K \sum_{n=0}^{2M/K-1} w(n) \exp(j\pi(k+0.5)(2Kn+A)/(2M)) \quad (0 \le k \le M/K - 1)$$

→ END

FIG. 14

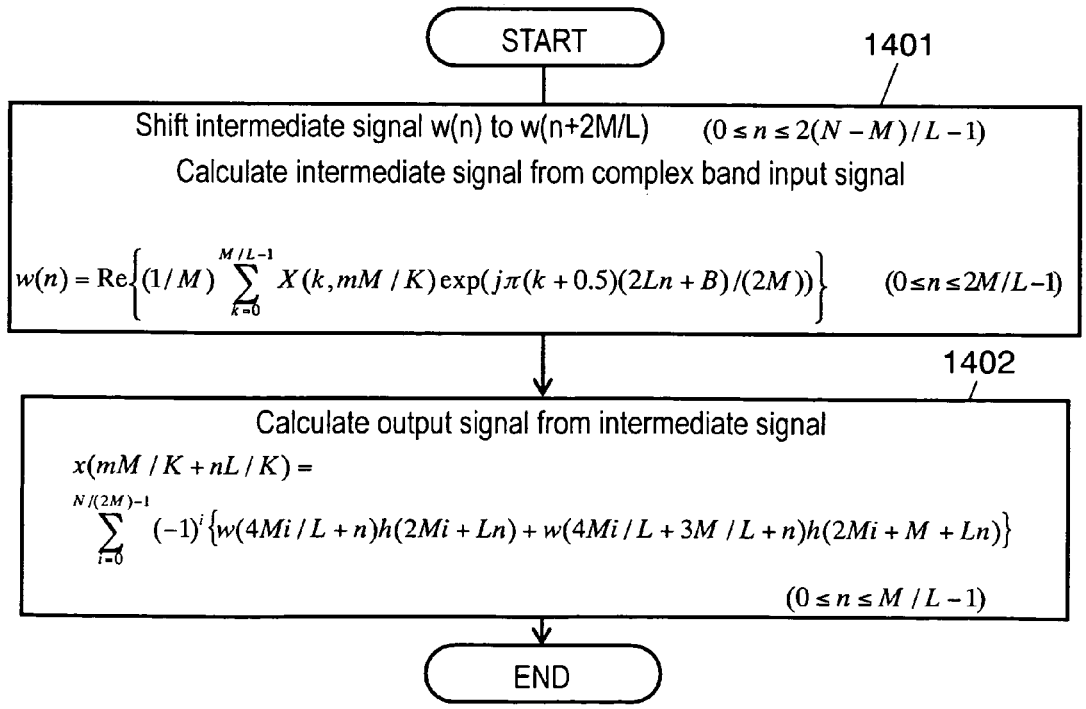

START → 1401 Shift intermediate signal $w(n)$ to $w(n+2M/L)$ $\quad (0 \le n \le 2(N-M)/L - 1)$
Calculate intermediate signal from complex band input signal $$w(n) = \text{Re}\left\{(1/M) \sum_{k=0}^{M/L-1} X(k, mM/K) \exp(j\pi(k+0.5)(2Ln+B)/(2M))\right\} \quad (0 \le n \le 2M/L - 1)$$

→ 1402 Calculate output signal from intermediate signal $$x(mM/K + nL/K) = \sum_{i=0}^{N/(2M)-1} (-1)^i \{w(4Mi/L + n)h(2Mi + Ln) + w(4Mi/L + 3M/L + n)h(2Mi + M + Ln)\}$$

$(0 \le n \le M/L - 1)$

→ END

SIGNAL ANALYZING METHOD, SIGNAL SYNTHESIZING METHOD OF COMPLEX EXPONENTIAL MODULATION FILTER BANK, PROGRAM THEREOF AND RECORDING MEDIUM THEREOF

FIELD OF THE INVENTION

This invention relates to signal analyzing and signal synthesizing methods of a complex exponential modulation filter bank with low electric power consumption or high speed by reducing quantity of arithmetic operation.

BACKGROUND OF THE INVENTION

In recent years, a signal analysis filter bank which divides a signal into a plurality of band signals and a signal synthesis filter bank which reproduces an original signal by synthesizing the band signals have drawn attention as signal analyzing and signal synthesizing means which realizes high efficiency coding due to sub-band coding of audio signals and image signals. In particular, in such a bandwidth extension technique of an audio signal for realizing wideband reproduction with a few amount of information, a complex exponential modulation filter bank has been drawn attention. The complex exponential modulation filter bank has such an advantage that there occurs no aliasing even if gain is changed with respect to each band, unlike a cosine modulation filter bank which has been used in MPEG (Moving Picture Experts Group)-1 audio etc. Therefore, it is usable as various digital equalizers. However, the complex exponential modulation filter bank handles band signals with complex numbers, and therefore, it has such a drawback that quantity of arithmetic operation is large, as compared to the cosine modulation filter bank which handles the band signals with real numbers.

For example, in AAC+SBR (Spectral Band Replication) which is a bandwidth extension technique of MPEG (Moving Picture Experts Group) AAC (Advanced Audio Coding), the complex exponential modulation filter bank is used. This complex exponential modulation filter bank is disclosed in ISO/IEC 14496-3:2001, Information technology—Coding of audio-visual objects—Part 3: Audio, ISO/IEC JTC1/SC29/WG11/N5570, March 2003 (Text of ISO/IEC 14496-3:2001/FDAM1, Bandwidth Extension).

Hereinafter, a conventional signal analyzing and signal synthesizing method of a complex exponential modulation filter bank will be described. FIG. 12 is a block diagram which shows configurations of a signal analysis filter bank and a signal synthesis filter bank.

In FIG. 12, signal analysis filter bank 1201 includes sampling frequency K times interpolator 1203 and M analysis band-pass filters 1204 and M decimators 1205. The signal synthesis filter bank 1202 includes M interpolators 1206, M synthesis band-pass filters 1207, adder 1208, and sampling frequency 1/L times decimator 1209. The analysis band-pass filter 1204 and the synthesis band-pass filter 1207 are paired each other. Here, K and L are a divisor of number of bands M, and a positive integers including 1. Meanwhile, it is also possible, in FIG. 12, to realize a configuration which does not have sampling frequency K times interpolator 1203, or sampling frequency 1/L times decimator 1209 (i.e., such a configuration that a value of K or L is 1).

Firstly, an operation of the signal analysis filter bank 1201 will be described. In the sampling frequency K times interpolator 1203, by inserting (K−1) zero data with respect to each data, to an input signal with sampling frequency fs, sampling frequency is elevated by K times, to become Kfs.

Next, this signal becomes band-pass signals by analysis band-pass filter 1204 which divides an entire band into M bands with equal bandwidth, and (M−1) data are removed with respect to each M data, by decimator 1205, and 1 piece data is outputted, and thereby, it is converted into a band signal with sampling frequency fsK/M, and outputted. Since sampling frequency of an input signal is set to K times, a band signal in (M/K)-th band or above is zero.

Next, an operation of signal synthesis filter bank 1202 will be described. A band signal with sampling frequency fsK/M which was outputted from signal analysis filter bank 1201 is used as an input, and (M−1) zero data is inserted by interpolator 1206 with respect to each 1 piece of data, and thereby, sampling frequency is elevated to Kfs which is M times. This signal is converted into band-pass signals by M synthesis band-pass filters 1207 with equal bandwidth, and thereafter, they are synthesized by adder 1208, so that a signal with sampling frequency Kfs is reproduced. Next, by sampling frequency 1/L times decimator 1209, (L−1) pieces of data are removed with respect to each L pieces of data, so that a signal with sampling frequency fsK/L is outputted.

In sub-band coding of audio signals and image signals, information compression is carried out between the signal analysis filter bank and the signal synthesis filter bank, through the use of deviation of distribution of a frequency direction of a band signal, and an auditory characteristic or a visual characteristic of humans to realize a high efficiency coding.

As described in international publication number WO 02/080362 A1 document, the complex exponential modulation filter bank is configured by modulating a prototype filter with complex exponentials. By this patent document, assuming that a filter coefficient of a linear phase non-recursive type prototype filter is h(n) ($0 \leq n \leq N$, N is a filter order), a filter coefficient ha(k, n) of n sample in k-th band of a complex exponential modulation signal analysis filter bank is given by (formula 1) (j is imaginary unit, and A is phase for signal analysis).

$$ha(k,n)=Kh(Kn)\exp(j\pi(k+0.5)(2Kn+A)/(2M)) \quad \text{(formula 1)}$$

Therefore, when values of filter coefficients of first and last prototype filters are set to be zero, assuming that an input signal at sampling time n of a signal analysis filter bank is x(n), complex band output signal X(k, mM/K) at sample time mM/K in k-th band ($0 \leq k \leq M/K-1$) is give by (formula 2).

$$X(k, mM/K) = K \sum_{n=0}^{N/K-1} h(Kn)\exp(j\pi(k+0.5)(2Kn+A)/(2M))x(mM/K-n) \quad \text{(formula 2)}$$

If (formula 2) is calculated directly, quantity of arithmetic operation becomes large, and therefore, as shown below, a complex exponential modulation signal analysis filter bank with reduced quantity of arithmetic operation is used. FIG. 13 is a flow chart which shows processing steps of a conventional analyzing method of a complex exponential modulation signal analysis filter bank. In step 1301, intermediate signal w(n) is calculated by (formula 3) from input signal x(n) at sampling time n.

$$w(n) = \sum_{i=0}^{N/(2M)-1} (-1)^i x(mM/K - 2Mi/K - n)h(2Mi + Kn) \quad \text{(formula 3)}$$

$$(0 \leq n \leq 2M/K - 1)$$

Next, in step 1302, complex band output signal X (k, mM/K) at sampling time mM/K in k-th band ($0 \leq k \leq M/K-1$) is calculated by (formula 4) (A is phase for signal analysis) from intermediate signal w(n).

$$X(k, mM/K) = \quad \text{(formula 4)}$$

$$K \sum_{n=0}^{2M/K-1} w(n)\exp(j\pi(k+0.5)(2Kn+A)/(2M))$$

$$(0 \leq k \leq M/K - 1)$$

For example, pages 60 and 62 in the above-described ISO/IEC document describe an example of a complex exponential modulation signal analysis filter bank for such a case that number of bands M is 64, and filter order N of a prototype filter is 640, and scaling factor k of up-sampling is 2, and phase A of signals is −1. In this regard, however, this document uses c(n) which was calculated by (formula 5) from h(n), in lieu of filter coefficient h(n) of the prototype filter.

$$c(n)=(-1)^{INT(n/2M)}h(n) \; (0 \leq n \leq N-1) \quad \text{(formula 5)}$$

Here, INT(x) is a function for making an integer with truncation of a fractional part of x.

In a conventional example of FIG. 13, by introducing an intermediate signal, it is possible to reduce quantity of arithmetic operation, as compared to a case of directly calculating (formula 2).

Here, quantity of arithmetic operation, which is necessary for realizing the complex exponential modulation signal analysis filter bank of FIG. 13, is evaluated with number of real number addition and number of real number multiplication.

In step 1301, assuming that c(n), which was calculated by (formula 5) in advance, is stored in a table and used, in lieu of h(n), the number of real number addition is (N/2M−1)(2M/K)=N/K−2M/K times, and the number of real number multiplication is (N/2M)(2M/K)=N/K times.

In step 1302, assuming that K exp(jπ(k+0.5)(2Kn+A)/(2M)) is calculated in advance and stored in a table to be used, the number of real number addition is 2(2M/K−1)(M/K)=4(M/K)$^2$−2(M/K) times, and the number of real number multiplication is 2(2M/K)(M/K)=4(M/K)$^2$ times.

Assuming that order N of the prototype filer is 640, and number of bands M is 64, and scaling factor K of up-sampling is 1, the number of real number addition is 512 times and the number of real number multiplication is 640 times, in step 1301, and the number of real number addition is 16256 times and the number of real number multiplication is 16384 times, in step 1302, and as a total of combination of step 1301 and step 1302, the number of real number addition is 16768 times and the number of real number multiplication is 17024 times.

Next, a conventional complex exponential modulation signal synthesis filter bank will be described. By the above-described patent publication document, filter coefficient hs(k, n) of n sample in k-th band of a complex exponential modulation signal synthesis filter bank is given by (formula 6) (B is phase for signal synthesis).

$$hs(k,n)=(1/M)h(Ln)\exp(j\pi(k+0.5)(2Ln+B)/(2M)) \quad \text{(formula 6)}$$

Here, phase B for signal synthesis satisfies a relational formula of (formula 7) (P is arbitrary integer) with phase A for signal analysis.

$$A+B+2N=8MP \quad \text{(formula 7)}$$

A real number part of summation in an effective band (band from 0-th band up to (M/L−1)-th band) of such a signal that an input complex band signal is convolved with the filter coefficient of (formula 6) is an output of signal synthesis filter bank 1202. When values of filter coefficients of first and last prototype filters are set to zero, assuming that a complex band input signal at sample time mM/K in k-th band of a complex exponential modulation signal synthesis filter bank is X(k, mM/K), output signal x(mM/K+nL/K) at sampling time mM/K+nL/K is given by (formula 8) (Re(x) is an real part of complex number x).

$$x(mM/K+nL/K) = \quad \text{(formula 8)}$$

$$\operatorname{Re}\left\{(1/M) \sum_{k=0}^{M/L-1} \sum_{l=0}^{N/L-1} X(k, mM/K+L(n-l))h(Ll)\exp(j\pi(k+0.5)(2Ll+B)/(2M))\right\}$$

$$(0 \leq n \leq M/L - 1)$$

If (formula 8) is calculated directly, quantity of arithmetic operation becomes large, and therefore, in the same manner as in the case of the complex exponential modulation signal analysis filter bank, a complex exponential modulation signal synthesis bank with reduced quantity of arithmetic operation is used as follows, in prior art. FIG. 14 is a flow chart which shows processing steps of a conventional synthesizing method of a complex exponential modulation signal synthesis filter bank. In step 1401, intermediate signal w(n) of $0 \leq n \leq 2(N-M)/L-1$ is shifted to w(n+2M/L), and intermediate signal w(n) of $0 \leq n \leq 2M/L-1$ is calculated by (formula 9), from complex band input signal X(k, mM/K) at sampling time mM/K in k-th band.

$$w(n) = \quad \text{(formula 9)}$$

$$\operatorname{Re}\left\{(1/M) \sum_{k=0}^{M/L-1} X(k, mM/K)\exp(j\pi(k+0.5)(2Ln+B)/(2M))\right\}$$

$$(0 \leq n \leq 2M/L - 1)$$

Next, instep 1402, output signal x(mM/K+nL/K) at sampling time mM/K+nL/K ($0 \leq n \leq M/L-1$) is calculated by (formula 10), from intermediate signal w(n).

$$x(mM/K+nL/K) = \qquad \text{(formula 10)}$$

$$\sum_{i=0}^{N/(2M)-1} (-1)^i \{w(4Mi/L+n)h(2Mi+Ln) +$$

$$w(4Mi/L+3M/L+n)h(2Mi+M+Ln)\}$$

$$(0 \leq n \leq M/L-1)$$

Pages 60, 61, and 63 of the above-described ISO/IEC document describe an example of a complex exponential modulation signal synthesis filter bank for such a case that number of bands M is 64, and filter order N of a prototype filter is 640, and scaling factor K of up-sampling is 2, and scaling factor 1/L of down-sampling is 1, and phase B for signal synthesis is −255.

Quantity of arithmetic operation, which is necessary for realizing the complex exponential modulation signal synthesis filter bank of FIG. 14, is evaluated with number of real number addition and number of real number multiplication.

In step 1401, assuming that (1/M)exp(jπ(k+0.5)(2Ln+B)/(2M)) is calculated in advance, and stored in a table to be used, the number of real number addition is (M/L−1)(2M/L)+(M/L)(2M/L)=4(M/L)²−2(M/L) times, and the number of real number multiplication is 2(M/L)(2M/L)=4(M/L)² times.

In step 1402, assuming that c(n), which was calculated by (formula 5), is stored in a table and used, in lieu of h(n), the number of real number addition is (N/M−1)(M/L)=N/L−M/L times, and the number of real number multiplication is (N/2M)2(M/L)=N/L times.

Assuming that order N of the prototype filer is 640, and number of bands M is 64, and scaling factor 1/L of down-sampling is 1, the number of real number addition is 16256 times and the number of real number multiplication is 16384 times, in step 1401, and the number of real number addition is 576 times and the number of real number multiplication is 640 times, in step 1402, and as a total of combination of step 1401 and step 1402, the number of real number addition is 16832 times and the number of real number multiplication is 17024 times.

SUMMARY OF THE INVENTION

A signal analyzing method of a complex exponential modulation filter bank is a signal analyzing method which makes up-sampling of an input signal with sampling frequency fs by K times, and divides it into M complex band signals with equal bandwidth and sampling frequency fsK/M to be outputted, and has a step of calculating a first intermediate signal from the input signal, a step of calculating a second intermediate signal from the first intermediate signal, a step of calculating a third intermediate signal from the second intermediate signal by fast Fourier transform, and a step of calculating a complex band output signal from the third intermediate signal.

A signal synthesizing method of a complex exponential modulation filter bank is a signal synthesizing method which synthesizes complex band input signals, and makes down-sampling to 1/L times (L is a divisor of M and a positive integer including 1), and outputs a signal with sampling frequency fsK/L, and has a step of calculating a first intermediate signal from the complex band input signal, a step of calculating a second intermediate signal from the first intermediate signal, with fast Fourier transform, a step of calculating a third intermediate signal from the second intermediate signal, and a step of calculating an output signal from the third intermediate signal.

A program is a program for having a computer or a digital signal processor execute the above-described signal analyzing and synthesizing methods of a complex exponential modulation filter bank.

A recording medium is a computer readable recording medium in which the above-described program for having a computer or a digital signal processor execute the above-described signal analyzing and synthesizing methods of a complex exponential modulation filter bank has been recorded.

BRIEF DESCRIPTION OF THE DRAWINGS

The invention, together with further advantages thereof, may best be understood by reference to the following description taken in conjunction with the accompanying drawings in which:

FIG. 13 is a flow chart which shows processing steps of a conventional signal analyzing method of a complex exponential modulation filter bank; and FIG. 14 is a flow chart which shows processing steps of a conventional signal synthesizing method of a complex exponential modulation filter bank.

DETAILED DESCRIPTION OF THE EXEMPLARY EMBODIMENTS

Figure 1:
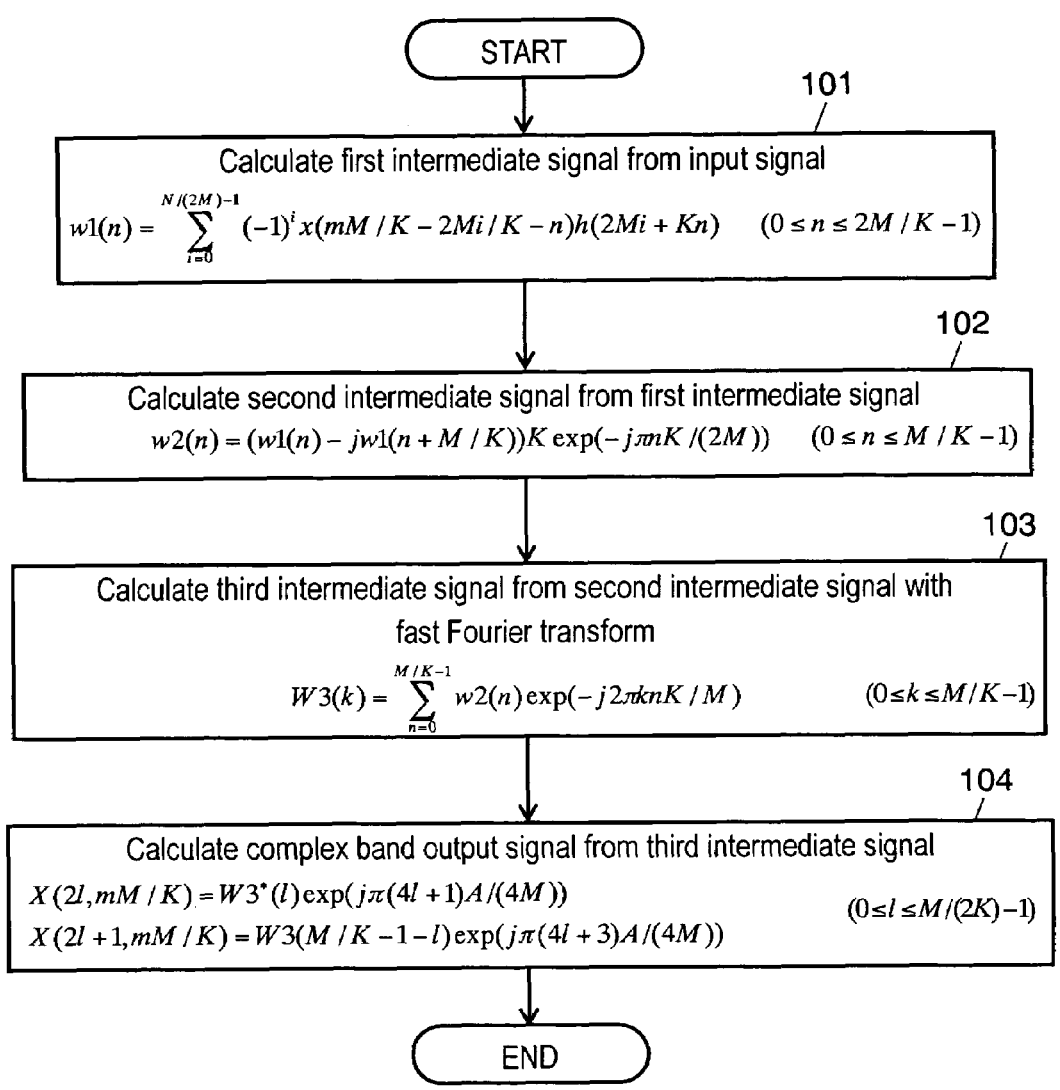
FIG. 1 is a flow chart which shows processing steps of a signal analyzing method of a complex exponential modulation filter bank in embodiment 1 of the invention.

As described above, the conventional signal analyzing method and signal synthesizing method of a complex exponential modulation filter bank have such a problem that quantity of arithmetic operation is large. Therefore, the conventional method has such a problem that operation clock frequency is heightened at the time of installing a filter bank by time-divisionally using the limited number of multipliers and adders as in a digital signal processor, so that electric power consumption is large. It also has such a problem that processing time is long at the time that a filter bank is executed by software, using a computer.

The invention is to solve the above-described conventional problems, and it is its object to provide a signal analyzing method and a signal synthesizing method, by which quantity of arithmetic operation can be reduced at the time of complex exponential modulation filter bank execution, and electric power consumption can be reduced. It is another object of the invention to provide a signal analyzing method and a signal synthesizing method by which processing time was shortened and can speed up at the time of complex exponential modulation filter bank execution.

In order to solve this problem, a signal analyzing method of the invention is a signal analyzing method of a complex exponential modulation filter bank which makes up-sampling of an input signal with sampling frequency fs by K times, and divides it into M complex band signals with equal bandwidth and sampling frequency fsK/M to be outputted, and has a step of calculating a first intermediate signal from the input signal, a step of calculating a second intermediate signal from the first intermediate signal, a step of calculating a third intermediate signal from the second intermediate signal by fast Fourier transform or inverse fast Fourier transform at M/K points, and a step of calculating a complex band output signal from the third intermediate signal.

A signal synthesizing method of the invention is a signal synthesizing method of a complex exponential modulation filter bank which synthesizes M complex band input signals with equal bandwidth and sampling frequency fsk/M, and makes down-sampling to 1/L times, and outputs a signal with sampling frequency fsK/L, and has a step of calculating a first intermediate signal from the complex band input signal, a step of calculating a second intermediate signal from the first intermediate signal, with fast Fourier transform or inverse fast Fourier transform at M/L point, and a step of shifting a third intermediate signal, and then, calculating the third intermediate signal from the second intermediate signal, and a step of calculating an output signal from the third intermediate signal.

By this, it is possible to effectively apply fast Fourier transform or inverse fast Fourier transform, through the use of periodicity of a complex exponential function, and therefore, it is possible to reduce quantity of arithmetic operation in a complex exponential modulation filter bank.

The signal analyzing method and signal synthesizing method of the invention handle a real number part and an imaginary part as a complex number without separating them, and therefore, by setting up phase for signal analysis or phase for signal synthesis in such a manner that quantity of arithmetic operation becomes small, it is possible to further reduce quantity of arithmetic operation.

According to the invention, it is possible to reduce quantity of arithmetic operation at the time of complex exponential modulation filter bank execution. Therefore, it is possible to reduce operation clock frequency when a filter bank is implemented in a digital signal processor and LSI, and it is possible to realize a complex exponential modulation filter bank with low electric power consumption. It is also possible to reduce processing time when a complex exponential modulation filter bank is executed by software, using a computer, and it is possible to realize speeding-up of processing.

A signal analyzing method of a complex exponential modulation filter bank of the invention makes up-sampling of a signal with sampling frequency fs by K times (K is a divisor of number of bands M and a positive integer including 1), and divides it into M complex band signals with equal bandwidth and sampling frequency fsK/M. A signal synthesizing method of a complex exponential modulation filter bank of the invention synthesizes M complex band signals with equal bandwidth and sampling frequency fsK/M, and makes down-sampling to 1/L times (L is a divisor of M and a positive integer including 1), and outputs a signal with sampling frequency fsK/L. The complex exponential modulation filter bank is configured by applying complex exponential modulation to a prototype filter. In the following embodiments, it is assumed that filter order of a linear phase non-recursive type prototype filter is N, and filter coefficient is $h(n)(0 \leq n \leq N)$, and values of first and last filter coefficients are set to zero ($h(0)=h(N)=0$).

Embodiments of the invention will be hereinafter described with reference to the drawings.

Embodiment 1

FIG. 1 is a flow chart which shows processing steps of a signal analyzing method of a complex exponential modulation filter bank in embodiment 1 of the invention.

In step 101, a first intermediate signal is calculated from an input signal. Assuming that an input signal at sampling time n is x(n), a first intermediate signal $w1(n)(0 \leq n \leq 2M/K-1)$ is calculated by (formula 11) from the input signal.

$$w1(n) = \sum_{i=0}^{N/(2M)-1} (-1)^i x(mM/K - 2Mi/K - n)h(2Mi + Kn) \quad \text{(formula 11)}$$

$$(0 \leq n \leq 2M/K - 1)$$

Step 101 is identical to step 1301 in the conventional example of FIG. 13. Assuming that c(n), which was calculated by (formula 12) in advance, is stored in a table and used, in lieu of h(n), (formula 11) becomes (formula 13).

$$c(n)=(-1)^{INT(n/2M)}h(n) \ (0 \leq n \leq N-1) \quad \text{(formula 12)}$$

$$w1(n) = \sum_{i=0}^{N/(2M)-1} x(mM/K - 2Mi/K - n)c(2Mi + Kn) \quad \text{(formula 13)}$$

$$(0 \leq n \leq 2M/K - 1)$$

Therefore, the number of real number addition, which is necessary for executing step 101, is (N/2M−1)(2M/K)=N/K−2M/K times, and the number of real number multiplication is (N/2M)(2M/K)=N/K times.

In step 102, a second intermediate signal $w2(n)(0 \leq n \leq M/K-1)$ is calculated from the first intermediate signal by (formula 14)(j is imaginary unit).

$$w2(n)=(w1(n)-jw1(n+M/K))K \exp(-j\pi nK/(2M))$$
$$(0 \leq n \leq M/K-1) \quad \text{(formula 14)}$$

Here, assuming that K exp(−jπnK/(2M)) is stored in a table and used, 1 time multiplication of complex numbers (complex multiplication) can be executed by 2 times of real number addition and 4 times of real number multiplication, and therefore, the number of real number addition, which is necessary for executing step 102, is 2M/K times, and the number of real number multiplication is 4M/K times.

In step 103, a third intermediate signal W3(k)(0≦k≦M/K−1) is calculated from the second intermediate signal by fast Fourier transform (FFT) through the use of (formula 15).

$$W3(k) = \sum_{n=0}^{M/K-1} w2(n)\exp(-j2\pi knK/M) \quad \text{(formula 15)}$$

$$(0 \leq k \leq M/K - 1)$$

In FFT at M/K points, butterfly operations with (M/(2k)) log$_2$(M/K) times are needed. 1 time butterfly operation includes 2 times of complex addition and 1 time of complex multiplication, and therefore, if this is converted into real number operation, 6 times of real number addition and 4 times of real number multiplication are needed. Therefore, the number of real number addition, which is necessary for executing step 103, is (3M/K)log$_2$(M/K) times, and the number of real number multiplication is (2M/K)log$_2$(M/K) times.

In step 104, complex band output signal X(k, mM/K) at sampling time mM/K in k-th band (0≦k≦M/K−1) is calculated from the third intermediate signal by (formula 16)(* is conjugate complex number, and A is phase for signal analysis) in case that k is an even number (k=2i), and in case that k is an odd number (k=2l+1), it is calculated by (formula 17).

$$X(2l, mM/K) = W3^*(l)\exp(j\pi(4l+1)A/(4M)) \quad (0 \leq l \leq M/(2K)-1) \quad \text{(formula 16)}$$

$$X(2l+1, mM/K) = W3(M/K-1-l)\exp(j\pi(4l+3)A/(4M)) \quad (0 \leq l \leq M/(2K)-1) \quad \text{(formula 17)}$$

Since up-sampling with K times is applied to the input signal, an effective band of the complex band output signal is from 0-th band up to (M/K−1)-th band, and the complex band output signal in M/K-th band or above is zero.

In order to execute step 104, complex multiplication with M/K times is necessary, and therefore, real number addition with 2M/K times and real number multiplication with 4M/K times are necessary.

Therefore, if the number of arithmetic operation necessary for executing embodiment 1 of FIG. 1 is calculated by summation of the number of arithmetic operation in the above-described each step, the number of real number addition is N/K+2M/K+(3M/K)log$_2$(M/K) times, and the number of real number multiplication is N/K+8M/K+(2M/K)log$_2$(M/K) times. Assuming that order N of a prototype filter is 640, and number of bands M is 64, and scaling factor K of up-sampling is 1, quantity of arithmetic operation necessary for executing embodiment 1 is of 1920 times as the number of real number addition, and 1920 times as the number of real number multiplication. Comparing this with the conventional example (16768 times as the number of real number addition, and 17024 times as the number of real number multiplication), it is possible in embodiment 1 to reduce both of the number of real number addition and the number of real number multiplication to ⅛ or less of the conventional example.

An operation of embodiment 1 will be further described.

If (formula 14) is substituted for (formula 15) to transform the formula, (formula 18) is realized. A final formula in (formula 18) is substituted for (formula 16), (formula 19) is realized.

$$W3(k) = \sum_{n=0}^{M/K-1} (w1(n) - jw1(n + \quad \text{(formula 18)}$$
$$M/K)K\exp(-j\pi(2k+0.5)nK/M)$$
$$= \sum_{n=0}^{M/K-1} w1(n)K\exp(-j\pi(2k+0.5)nK/M) +$$
$$\sum_{n=0}^{M/K-1} (-j)w1(n+$$
$$M/K)K\exp(-j\pi(2k+0.5)nK/M)$$
$$= \sum_{n=0}^{M/K-1} w1(n)K\exp(-j\pi(2k+0.5)nK/M) +$$
$$\sum_{n=0}^{M/K-1} w1(n+M/K)K\exp(-j\pi(2k+$$
$$0.5)(n+M/K)K/M)$$
$$W3(k) = \sum_{n=0}^{2M/K-1} w1(n)K\exp(-j\pi(2k+0.5)nK/M)$$

$$X(2l, mM/K) = W3^*(l)\exp(j\pi(4l+1)A/(4M)) \quad \text{(formula 19)}$$
$$= \exp(j\pi(4l+1)A/$$
$$(4M))\sum_{n=0}^{2M/K-1} w1(n)K\exp(j\pi(2l+$$
$$0.5)nK/M)$$
$$= K\sum_{n=0}^{2M/K-1} w1(n)\exp(j\pi(2l+$$
$$0.5)(2Kn+A)/(2M))$$

(Formula 19) is coincident with such a formula that w is substituted for w1 in (formula 4) and k=2i is set up. In the same manner, it is possible to explain that (formula 17) is coincident with such a formula that w is substituted for w1 in (formula 4) and k=2l+1 is set up. Therefore, embodiment 1 can calculate an identical result to the conventional example of FIG. 13.

Figure 2:
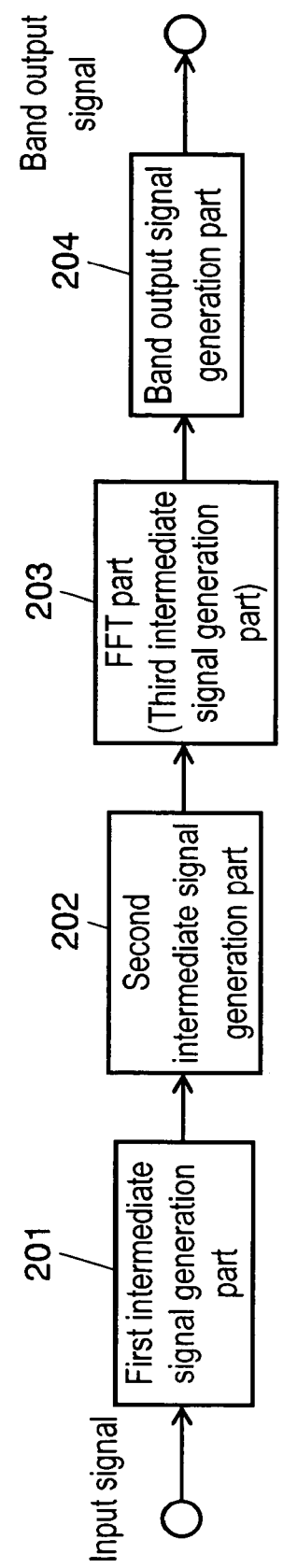
FIG. 2 is a block diagram which shows a configuration of a device for carrying out the signal analyzing method of the complex exponential modulation filter bank in embodiment 1 of the invention.

FIG. 2 is a block diagram which shows a configuration of a device which executes the signal analyzing method of the complex exponential modulation filter bank in embodiment 1.

In FIG. 2, first intermediate signal generation part 201 executes (formula 13) from an input signal and filter coefficient of a prototype filter, to output a first intermediate signal. Second intermediate signal generation part 202 executes (formula 14) from the first intermediate signal which was outputted from first intermediate signal generation part 201, to output a second intermediate signal. FFT part 203 executes (formula 15) by fast Fourier transform at M/K points to the second intermediate signal which was outputted from second intermediate signal generation part 202, to output its result as a third intermediate signal. Band division output signal generation part 204 calculates and outputs a complex band output signal in accordance with (formula 16) and (formula 17) from the third intermediate signal which was outputted from FFT part 203.

As above, in the signal analyzing method of the complex exponential modulation filter bank in embodiment 1, it is possible to reduce quantity of arithmetic operation necessary for execution of a complex exponential modulation signal analysis filter bank, by effectively applying fast Fourier transform through the use of periodicity of a complex exponential function. By this, it is possible to reduce operation clock frequency at the time of implementing a complex exponential modulation signal analysis filter bank in a digital signal processor and LSI, and it is possible to realize a complex exponential modulation signal analysis filter bank with low electric power consumption. It is also possible to shorten processing time at the time of realizing a complex exponential modulation signal analysis filter bank by software, using a computer, and it is possible to realize speeding-up of processing.

Embodiment 2

Figure 3:
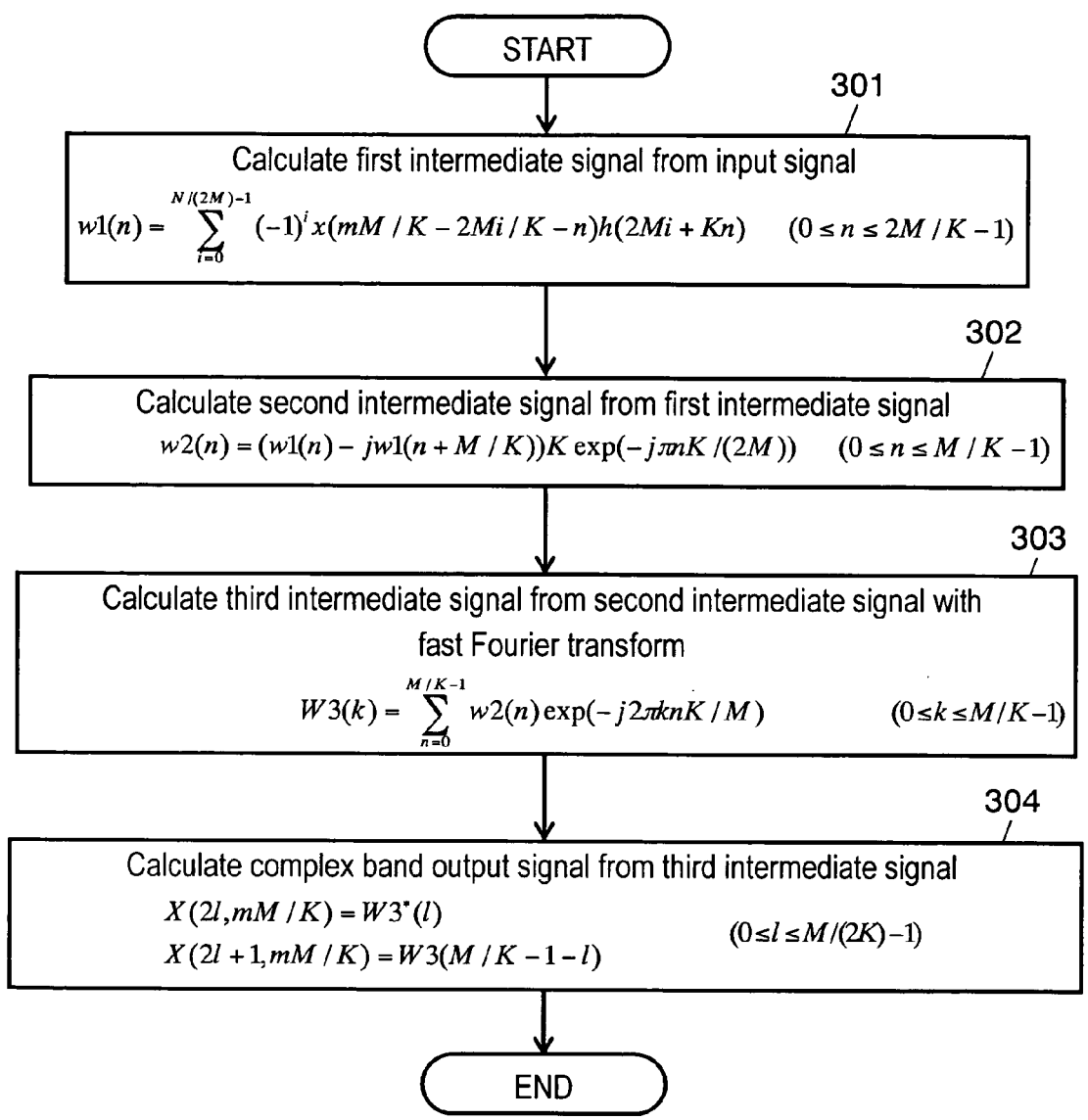
FIG. 3 is a flow chart which shows processing steps of a signal analyzing method of a complex exponential modulation filter bank in embodiment 2 of the invention.

FIG. 3 is a flow chart which shows processing steps of a signal analyzing method of a complex exponential modulation filter bank in embodiment 2 of the invention.

Embodiment 2 is such a thing that phase A for signal analysis in embodiment 1 was set up to 8MP (P is arbitrary integer).

Steps 301, 302 and 303 of FIG. 3 are identical to steps 101, 102 and 103 of FIG. 1, respectively, and explanations will be omitted.

In step 304, complex band output signal X(k, mM/K) at sampling time mM/K in k-th band ($0 \leq k \leq M/K-1$) is calculated from the third intermediate signal by (formula 20) in case that k is an even number (K=2l), and by (formula 21) in case that k is an odd number (k=2l+1).

$$X(2l, mM/K) = W3^*(l) \quad (0 \leq l \leq M/(2K)-1) \quad \text{(formula 20)}$$

$$X(2l+1, mM/K) = W3(M/K-1-l) \quad (0 \leq l \leq M/(2K)-1) \quad \text{(formula 21)}$$

In order to execute step 104 of FIG. 1 in embodiment 1, complex multiplication with M/K times is necessary, and real number addition with 2M/K times and real number multiplication with 4M/K times are necessary. However, in step 304, complex multiplication is unnecessary, and quantity of arithmetic operation can be reduced by just that much.

Therefore, if the number of arithmetic operation necessary for executing embodiment 2 of FIG. 3 is calculated by summation of the number of arithmetic operation in each step of FIG. 3, the number of real number addition is $N/K+(3M/K)\log_2(M/K)$ times, and the number of real number multiplication is $N/K+4M/K+(2M/K)\log_2(M/K)$ times. Assuming that order N of a prototype filter is 640, and number of bands M is 64, and scaling factor K of up-sampling is 1, quantity of arithmetic operation necessary for executing embodiment 2 is of 1792 times as the number of real number addition, and 1664 times as the number of real number multiplication. Comparing this with embodiment 1, the number of real number addition is less by 128 times, and the number of real number multiplication is less by 256 times.

As above, in the signal analyzing method of the complex exponential modulation filter bank of embodiment 2, it is possible to further reduce quantity of arithmetic operation as compared with embodiment 1, by setting up the phase for signal analysis to a specific value.

Meanwhile, in embodiment 2, phase A for signal analysis is set up to 8MP, but phase A of a signal may be set up to any one of the following (condition 2), (condition 3) and (condition 4).

$$A = 8MP \quad \text{(condition 1)}$$

$$A = 2M + 8MP \quad \text{(condition 2)}$$

$$A = 4M + 8MP \quad \text{(condition 3)}$$

$$A = 6M + 8MP \quad \text{(condition 4)}$$

Even in case that phase A for signal analysis was set up to any one of (condition 2), (condition 3) and (condition 4), complex multiplication becomes unnecessary in a step of calculating a complex band output signal from the third intermediate signal, and it is possible to reduce quantity of arithmetic operation as compared with embodiment 1.

(Condition 2) is of such a case that phase A for signal analysis was set up to 2M+8MP, and when k is an even number (k=2l), a complex band output signal is calculated by (formula 22), and when k is an odd number (k=2l+1), the complex band output signal is calculated by (formula 23).

$$X(2l, mM/K) = jW3^*(l) \quad (0 \leq l \leq M/(2K)-1) \quad \text{(formula 22)}$$

$$X(2l+1, mM/K) = -jW3(M/K-1-l) \quad (0 \leq l \leq M/(2K)-1) \quad \text{(formula 23)}$$

To multiply with imaginary unit j in (formula 22) means to make a real number part as an imaginary part, and also, a sign of the imaginary part is inverted to be made as the real number part, so that multiplication is unnecessary. In the same manner, to multiply with −j in (formula 23) means to invert a sign of a real number part to be made as an imaginary part, and to make the imaginary part to the real number part, so that multiplication is unnecessary.

(Condition 3) is of such a case that phase A for signal analysis was set up to 4M+8MP, and when k is an even number (k=2l), a complex band output signal is calculated by (formula 24), and when k is an odd number (k=2l+1), the complex band output signal is calculated by (formula 25).

$$X(2l, mM/K) = -W3^*(l) \quad (0 \leq l \leq M/(2K)-1) \quad \text{(formula 24)}$$

$$X(2l+1, mM/K) = -W3(M/K-1-l) \quad (0 \leq l \leq M/(2K)-1) \quad \text{(formula 25)}$$

(Condition 4) is of such a case that phase A for signal analysis was set up to 6M+8MP, and when k is an even number (k=2l), a complex band output signal is calculated by (formula 26), and when k is an odd number (k=2l+1), the complex band output signal is calculated by (formula 27).

$$X(2l, mM/K) = -jW3^*(l) \quad (0 \leq l \leq M/(2K)-1) \quad \text{(formula 26)}$$

$$X(2l+1, mM/K) = jW3(M/K-1-l) \quad (0 \leq l \leq M/(2K)-1) \quad \text{(formula 27)}$$

As above, in the signal analyzing method of the complex exponential modulation filter bank of embodiment 2, it is possible to further reduce quantity of arithmetic operation as compared with embodiment 1, by setting up phase for signal analysis in such a manner that there occurs no multiplication in a step of calculating the complex band output signal from the third intermediate signal.

Embodiment 3

Figure 4:
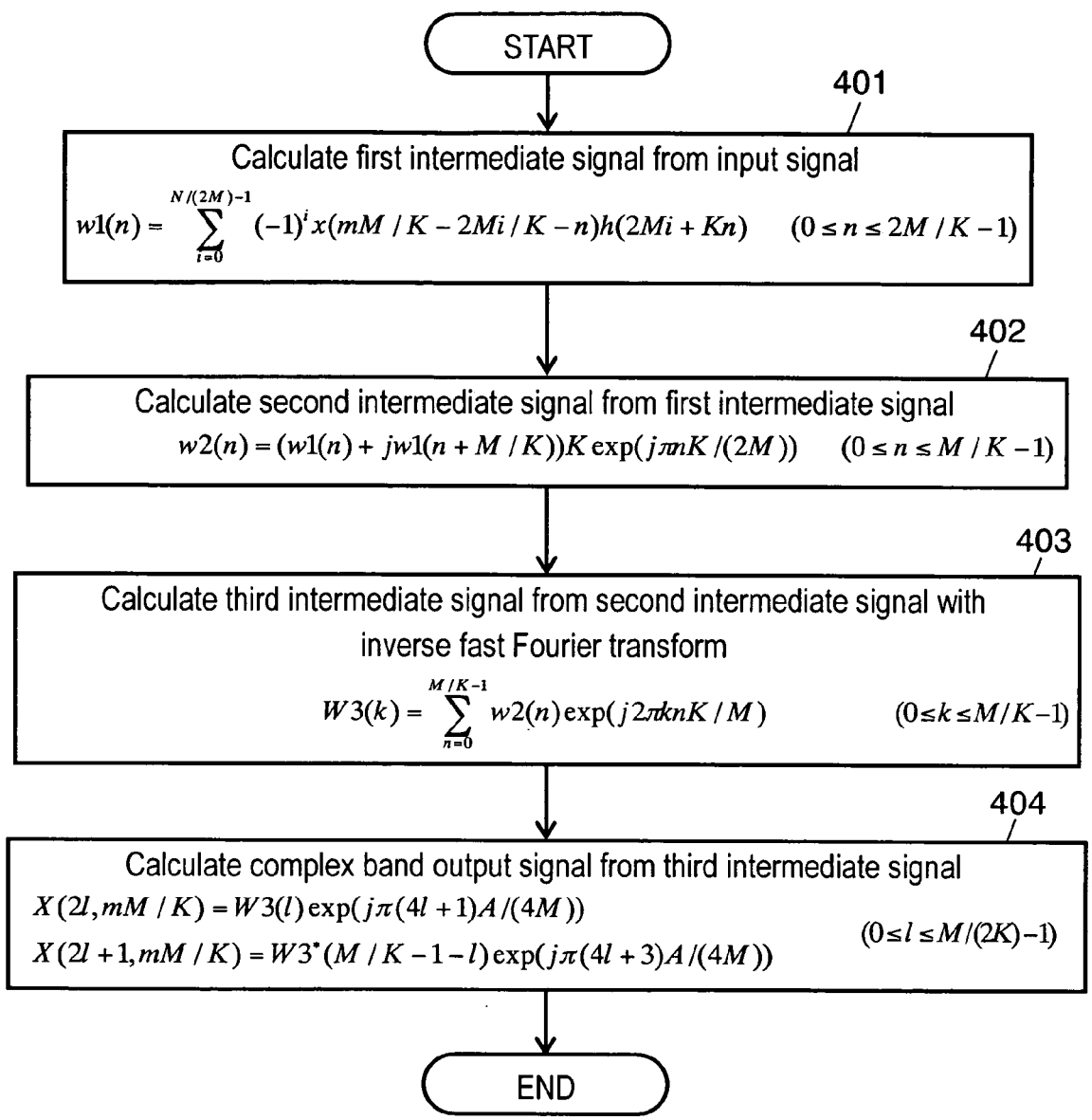
FIG. 4 is a flow chart which shows processing steps of a signal analyzing method of a complex exponential modulation filter bank in embodiment 3 of the invention.

FIG. 4 is a flow chart which shows processing steps of a signal analyzing method of a complex exponential modulation filter bank in embodiment 3 of the invention. In embodiment 1, reduced is quantity of arithmetic operation necessary for execution of the complex exponential modulation signal analysis filter bank, by effectively applying fast Fourier transform. In embodiment 3, reduced is quantity of arithmetic operation necessary for execution of the complex exponential modulation signal analysis filter bank by effectively applying inverse fast Fourier transform (IFFT). In FIG. 4, step 401 is identical to step 101 of FIG. 1, and explanation will be omitted.

In step 402, second intermediate signal w2(n)(0≦n≦M/K−1) is calculated from the first intermediate signal by (formula 28).

$$w2(n)=(w1(n)+jw1(n+M/K))K\exp(\pi nK/(2M))$$
$$(0\leq n\leq M/K-1) \qquad \text{(formula 28)}$$

Here, assuming that Kexp(jπnK/(2M)) is stored in a table and used, the number of complex multiplication necessary for executing step 402 is M/K times. If this is converted into real number operation, the number of real number addition is 2M/K times, and the number of real number multiplication is 4M/K times.

In step 403, third intermediate signal W3(k) (0≦k≦M/K−1) is calculated from the second intermediate signal with inverse fast Fourier transform by (formula 29).

$$W3(k) = \sum_{n=0}^{M/K-1} w2(n)\exp(j2\pi knK/M) \qquad \text{(formula 29)}$$
$$(0 \leq k \leq M/K - 1)$$

IFFT at M/K points requires butterfly operations with (M/(2K))log$_2$(M/K) times in the same manner as in FFT. Therefore, the number of real number addition necessary for executing step 403 is (3M/K)log$_2$(M/K) times, and the number of real number multiplication is (2M/K)log$_2$(M/K) times.

In step 404, a complex band output signal X(k, mM/K) at sampling time mM/K in k-th band (0≦k≦M/K−1) is calculated from the third intermediate signal by (formula 30) (A is phase for signal analysis) when k is an even number (k=2l), and by (formula 31) when k is an odd number (k=2l+1).

$$X(2l,mM/K)=W3(l)\exp(j\pi(4l+1)A/(4M)) \; (0\leq l\leq M/(2K)-1) \qquad \text{(formula 30)}$$

$$X(2l+1,mM/K)=W3^*(M/K-1-l)\exp(j\pi(4l+3)A/(4M)) \; (0\leq l\leq M/(2K)-1) \qquad \text{(formula 31)}$$

In order to execute step 404, complex multiplication by M/K times is necessary, and therefore, real number addition by 2M/K times and real number multiplication by 4M/K times are necessary.

Therefore, if the number of arithmetic operation necessary for executing embodiment 3 of FIG. 4 is calculated by summation of the number of arithmetic operation in the above-described each step, the number of real number addition is N/K+2M/K+(3M/K)log$_2$(M/K) times, and the number of real number multiplication is N/K+8M/K+(2M/K)log$_2$(M/K) times. This is the same quantity of arithmetic operation as in embodiment 1. Assuming that order N of a prototype filter is 640, and number of bands M is 64, and scaling factor K of up-sampling is 1, quantity of arithmetic operation necessary for executing embodiment 3 is of 1920 times as the number of real number addition, and 1920 times as the number of real number multiplication. Comparing this with the conventional example (16768 times as the number of real number addition, and 17024 times as the number of real number multiplication), it is possible in embodiment 3 to reduce both of the number of real number addition and the number of real number multiplication to ⅛ or less of the conventional example.

It is possible to explain that steps 402, 403 and 404 in embodiment 3 can output identical result to step 1302 in FIG. 13 of the conventional example, by substituting (formula 28) for (formula 29) and by further substituting its substitution result for (formula 30) and (formula 31), in the same manner as described in embodiment 1.

As above, in the signal analyzing method of the complex exponential modulation filter bank in embodiment 3, it is possible to reduce quantity of arithmetic operation necessary for execution of a complex exponential modulation signal analysis filter bank, by effectively applying inverse fast Fourier transform through the use of periodicity of a complex exponential function. By this, it is possible to reduce operation clock frequency at the time of implementing the complex exponential modulation signal analysis filter bank in a digital signal processor and LSI, and it is possible to realize the complex exponential modulation signal analysis filter bank with low electric power consumption. It is also possible to shorten processing time at the time of realizing the complex exponential modulation signal analysis filter bank by software, using a computer, and it is possible to realize speeding-up of processing.

Embodiment 4

Figure 5:
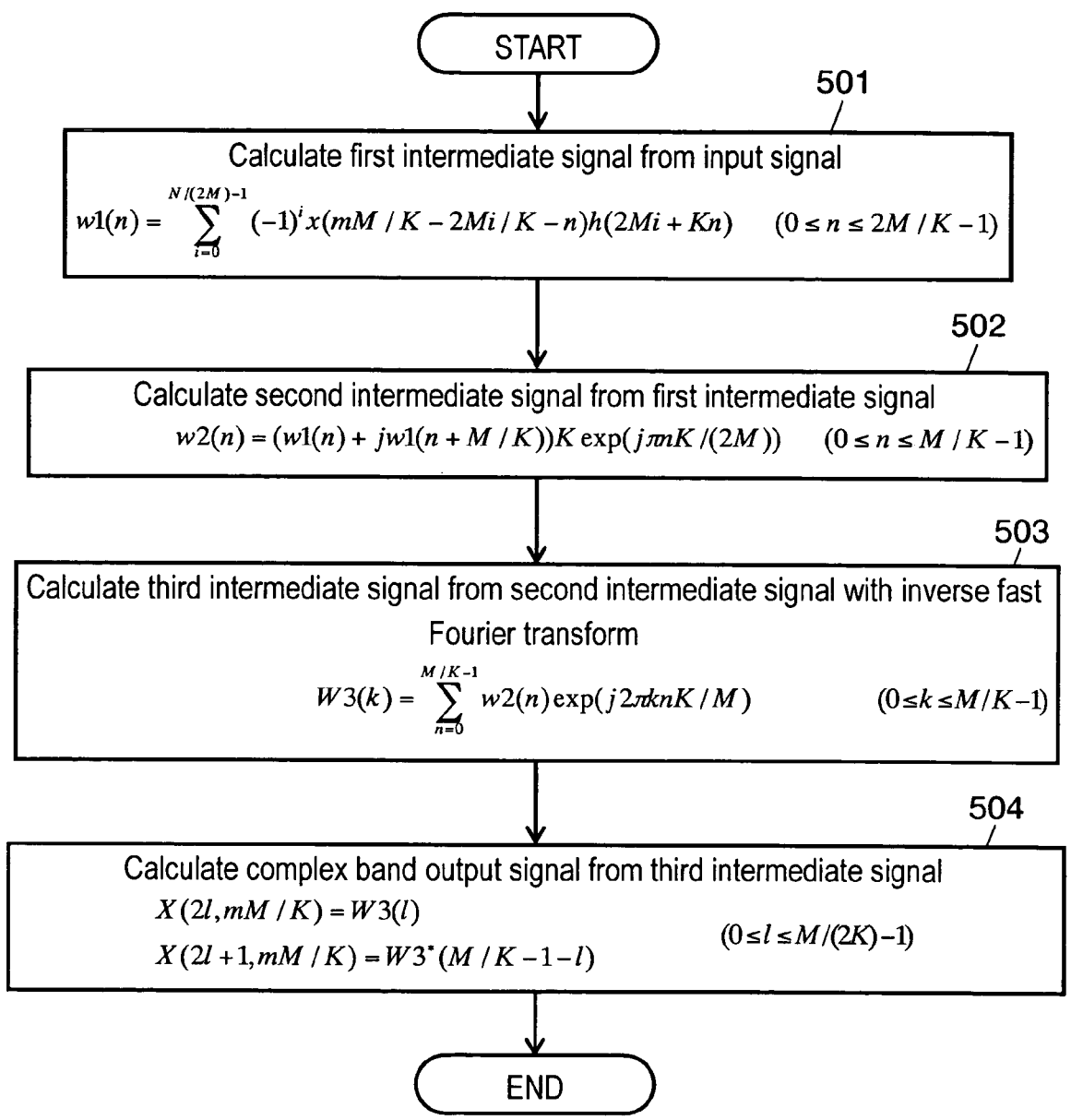
FIG. 5 is a flow chart which shows processing steps of a signal analyzing method of a complex exponential modulation filter bank in embodiment 4 of the invention.

FIG. 5 is a flow chart which shows processing steps of a signal analyzing method of a complex exponential modulation filter bank in embodiment 4 of the invention.

Embodiment 4 is of such a thing that phase A for signal analysis was set up to 8MP (P is an arbitrary integer) in embodiment 3.

Steps 501, 502 and 503 of FIG. 5 are identical to steps 401, 402 and 403 of FIG. 4, respectively, and explanations will be omitted.

In step 504, complex band output signal X (k, mM/K) at sampling time mM/K in k-th band (0≦k≦M/K−1) is calculated from the third intermediate signal by (formula 32) when k is an even number (k=2l), and by (formula 33) when k is an odd number (k=2l+1).

$$X(2l,mM/K)=W3(l) \; (0\leq l\leq M/(2K)-1) \qquad \text{(formula 32)}$$

$$X(2l+1,mM/K)=W3^*(M/K-1-l) \; (0\leq l\leq M/(2K)-1) \qquad \text{(formula 33)}$$

In order to execute step 404 of FIG. 4, complex multiplication by M/K times is necessary, and therefore, real number addition by 2M/K times and real number multiplication by 4M/K times are necessary. However, in step 504, complex multiplication is unnecessary and quantity of arithmetic operation can be reduced by just that much.

Therefore, if the number of arithmetic operation necessary for executing embodiment 4 of FIG. 5 is calculated by summation of the number of arithmetic operation in each step of FIG. 5, the number of real number addition is N/K+(3M/K)log$_2$(M/K) times, and the number of real number multiplication is N/K+4M/K+(2M/K)log$_2$(M/K) times. Assuming that order N of a prototype filter is 640, and number of bands M is 64, and scaling factor K of up-sampling is 1, quantity of arithmetic operation necessary for executing embodiment 4 is of 1792 times as the number of real number addition, and 1664 times as the number of real number multiplication. Comparing this with embodiment 3, the number of real number addition is less by 128 times, and the number of real number multiplication is less by 256 times.

As above, in the signal analyzing method of the complex exponential modulation filter bank of embodiment 4, it is possible to further reduce quantity of arithmetic operation as compared with embodiment 3, by setting up the phase for signal analysis to a specific value.

Meanwhile, in embodiment 4, phase A for signal analysis was set up to 8 MP, but phase A of a signal may be set up to any one of the following (condition 2), (condition 3) and (condition 4).

$$A=8MP \quad \text{(condition 1)}$$

$$A=2M+8MP \quad \text{(condition 2)}$$

$$A=4M+8MP \quad \text{(condition 3)}$$

$$A=6M+8MP \quad \text{(condition 4)}$$

Even in case that phase A for signal analysis was set up to any one of (condition 2), (condition 3) and (condition 4), complex multiplication becomes unnecessary in a step of calculating a complex band output signal from the third intermediate signal, and it is possible to reduce quantity of arithmetic operation as compared with embodiment 3.

(Condition 2) is of such a case that phase A for signal analysis was set up to 2M+8MP, and when k is an even number (k=2l), a complex band output signal is calculated by (formula 34), and when k is an odd number (k=2l+1), the complex band output signal is calculated by (formula 35).

$$X(2l,mM/K)=jW3(l) \ (0\leq l\leq M/(2K)-1) \quad \text{(formula 34)}$$

$$X(2l+1,mM/K)=-jW3^*(M/K-1-l) \ (0\leq l\leq M/(2K)-1) \quad \text{(formula 35)}$$

To multiply with imaginary unit j in (formula 34) means to make a real number part as an imaginary part, and also, a sign of the imaginary part is inverted to be made as the real number part, so that multiplication is unnecessary. In the same manner, to multiply with −j in (formula 35) means to invert a sign of a real number part to be made as an imaginary part, and to make the imaginary part to the real number part, so that multiplication is unnecessary.

(Condition 3) is of such a case that phase A for signal analysis was set up to 4M+8MP, and when k is an even number (k=2i), a complex band output signal is calculated by (formula 36), and when k is an odd number (k=2l+1), the complex band output signal is calculated by (formula 37).

$$X(2l,mM/K)=-W3(l) \ (0\leq l\leq M/(2K)-1) \quad \text{(formula 36)}$$

$$X(2l+1,mM/K)=-W3^*(M/K-1-l) \ (0\leq l\leq M/(2K)-1) \quad \text{(formula 37)}$$

(Condition 4) is of such a case that phase A for signal analysis was set up to 6M+8MP, and when k is an even number (k=2i), a complex band output signal is calculated by (formula 38), and when k is an odd number (k=2l+1), the complex band output signal is calculated by (formula 39).

$$X(2l,mM/K)=-jW3(l) \ (0\leq l\leq M/(2K)-1) \quad \text{(formula 38)}$$

$$X(2l+1,mM/K)=jW3^*(M/K-1-l) \ (0\leq l\leq M/(2K)-1) \quad \text{(formula 39)}$$

As above, in the signal analyzing method of the complex exponential modulation filter bank of embodiment 4, it is possible to further reduce quantity of arithmetic operation as compared with embodiment 3, by setting up phase for signal analysis in such a manner that there occurs no multiplication in a step of calculating the complex band output signal from the third intermediate signal.

Embodiment 5

Figure 6:
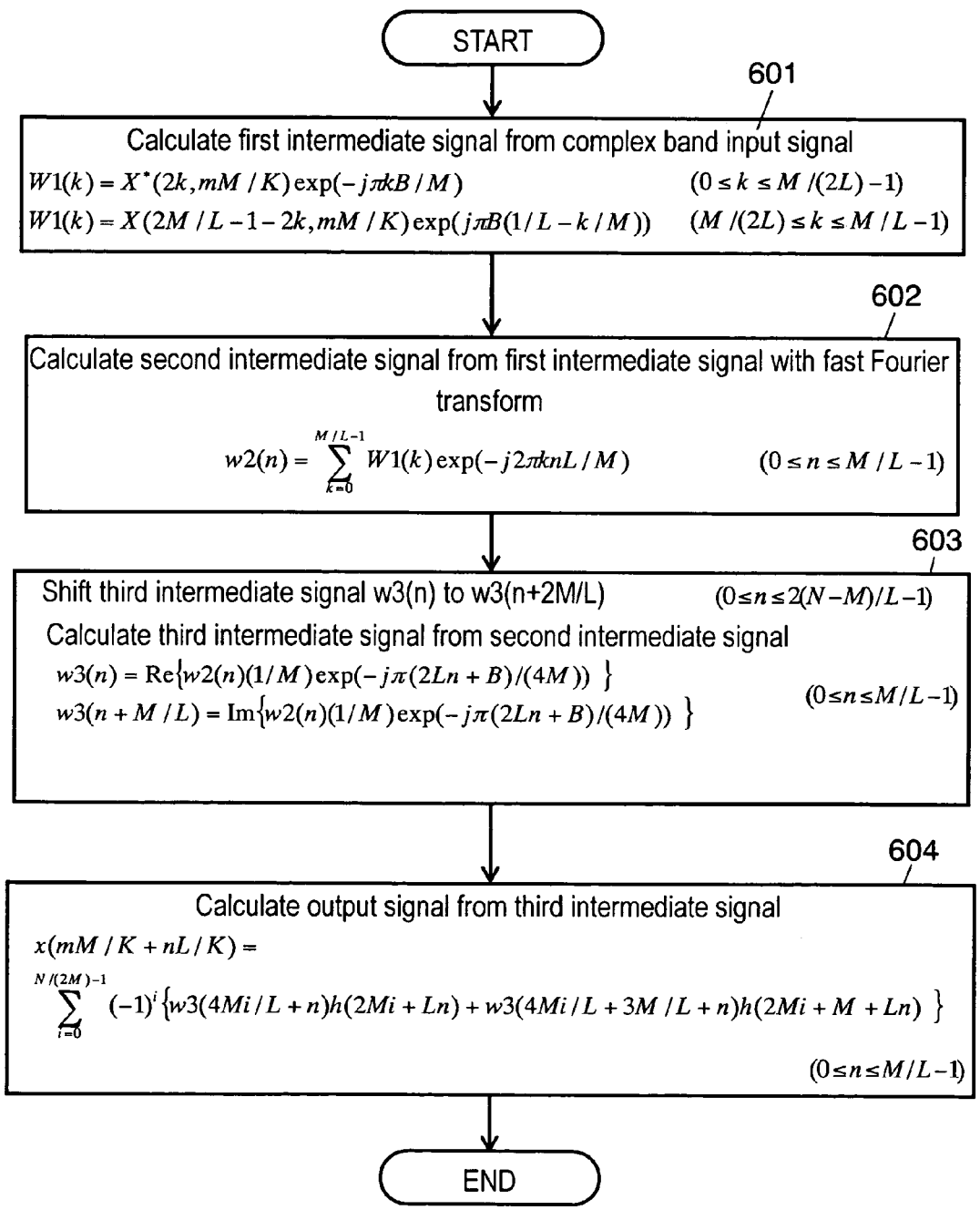
FIG. 6 is a flow chart which shows processing steps of a signal synthesizing method of a complex exponential modulation filter bank in embodiment 5 of the invention.

FIG. 6 is a flow chart which shows processing steps of a signal synthesizing method of a complex exponential modulation filter bank in embodiment 5 of the invention.

In step 601, a first intermediate signal is calculated from a complex band input signal. Assuming that a complex band input signal at sampling time mM/K in k-th band is set to X(k, mM/K), first intermediate signal W1(k) is calculated from the complex band input signal by (formula 40) of $0\leq k\leq M/(2L)-1$, and calculated by (formula 41) of $M/(2L)\leq k\leq M/L-1$.

$$W1(k)=X^*(2k,mM/K)\exp(-j\pi kB/M) \ (0\leq k\leq M/(2L)-1) \quad \text{(formula 40)}$$

$$W1(k)=X(2M/L-1-2k,mM/K)\exp(j\pi B(1/L-k/M)) \ (M/(2L)\leq k\leq M/L-1) \quad \text{(formula 41)}$$

B designates a phase for signal synthesis, and satisfies a relation formula of (formula 42) (P is an arbitrary integer) with phase A for signal analysis.

$$A+B+2N=8MP \quad \text{(formula 42)}$$

Here, assuming that exp(−jπkB/M) and exp(−jπB(1/L−k/M)) are stored in a table and used, in order to execute step 601, complex multiplication by M/L times is necessary, and if this is converted into real number operation, real number addition by 2M/L times and real number multiplication by 4M/L times are necessary.

In step 602, second intermediate signal w2(n) ($0\leq n\leq M/L-1$) is calculated from the first intermediate signal by fast Fourier transform through the use of (formula 43).

$$w2(n) = \sum_{k=0}^{M/L-1} W1(k)\exp(-j2\pi knL/M) \quad \text{(formula 43)}$$

$$(0 \leq n \leq M/L-1)$$

In step 602, the number of real number addition necessary for executing FFT at M/L point is $(3M/L)\log_2(M/L)$ times, and the number of real number multiplication is $(2M/L)\log_2(M/L)$ times.

In step 603, third intermediate signal w3(n) of $0\leq n\leq 2(N-M)/L-1$ is shifted to w3(n+2M/L), and then, third intermediate signals w3(n) and w3(n+M/L) of $0\leq n\leq M/L$ are calculated from the second intermediate signal by (formula 44) (Re(x) is an real part of a complex number x, and Im(x) is an imaginary part of x).

$$w3(n)=Re\{w2(n)(1/M)\exp(-j\pi(2Ln+B)/(4M))\}$$

$$w3(n+M/L)=Im\{w2(n)(1/M)\exp(-j\pi(2Ln+B)/(4M))\}$$
$$(0\leq n\leq M/L-1) \quad \text{(formula 44)}$$

In step 603, assuming that $(1/M)\exp(-j\pi(2Ln+B)/(4M))$ is stored in a table and used, in order to execute step 603, complex multiplication by M/L times is necessary, and if this is converted into real number operation, real number addition by M/L times and real number multiplication by 4M/L times are necessary.

In step 604, an output signal x(mM/K+nL/K) at sampling time mM/K+nL/K($0\leq n\leq M/L-1$) is calculated from the third intermediate signal by (formula 45).

$$x(mM/K + nL/K) = \sum_{i=0}^{N/(2M)-1} (-1)^i\{w3(4Mi/L+n)h(2Mi+Ln) + w3(4Mi/L+3M/L+n)h(2Mi+M+Ln)\} \quad \text{(formula 45)}$$

Step 604 is identical to step 1402 in the conventional example of FIG. 14.

Assuming that c(n), which was calculated by (formula 46) in advance, is stored in a table and used, in lieu of h(n), (formula 45) becomes (formula 47).

$$c(n)=(-1)^{INT(n/2M)}h(n) \ (0\leq n\leq N-1) \quad \text{(formula 46)}$$

$$x(mM/K + nL/K) = \sum_{i=0}^{N/(2M)-1} \{w3(4Mi/L+n)c(2Mi+Ln) + \quad \text{(formula 47)}$$

$$w3(4Mi/L+3M/L+n)c(2Mi+M+Ln)\}$$

$$(0 \leq n \leq M/L-1)$$

Therefore, the number of real number addition necessary for executing step 604 is (N/M−1)(M/L)=N/L−M/L times, and the number of real number multiplication is (N/2M)2(M/L)=N/L times.

If the number of arithmetic operation necessary for executing embodiment 5 of FIG. 6 is calculated by summation of the number of arithmetic operation in the above-described each step, the number of real number addition is N/L+3M/L+(3M/L)log$_2$(M/L) times, and the number of real number multiplication is N/L+8M/L+(2M/L)log$_2$(M/L) times. Assuming that order N of a prototype filter is 640, and number of bands M is 64, and scaling factor 1/L of down-sampling is 1, quantity of arithmetic operation necessary for executing embodiment 5 is of 1984 times as the number of real number addition, and 1920 times as the number of real number multiplication. Comparing this with the conventional example (16832 times as the number of real number addition, and 17024 times as the number of real number multiplication), it is possible in embodiment 5 to reduce both of the number of real number addition and the number of real number multiplication to ⅛ or less of the conventional example.

An operation of embodiment 5 will be further described.

If (formula 40) and (formula 41) are substituted for (formula 43) to transform the formula, (formula 48) is realized. If (formula 48) is substituted for an upper formula of (formula 44) to transform the formula, (formula 49) is realized.

$$w2(n) = \sum_{k=0}^{M/(2L)-1} X^*(2k, mM/K)\exp(-j\pi k(2Ln+B)/M) + \quad \text{(formula 48)}$$

$$\sum_{k=M/(2L)}^{M/L-1} X(2M/L-1-2k, mM/K)\exp(j\pi B/L)\exp(-j\pi k(2Ln+B)/M)$$

$$w3(n) = \text{Re}\{w2(n)(1/M)\exp(-j\pi(2Ln+B)/(4M))\} \quad \text{(formula 49)}$$

$$w3(n) = \text{Re}\{(1/M) \sum_{k=0}^{M/(2L)-1} X^*(2k, mM/K)\exp(-j\pi(2k+0.5)(2Ln+B)/(2M))\} +$$

$$\text{Re}\{(1/M)\sum_{k=M/(2L)}^{M/L-1} X(2M/L-1-2k, mM/K)\exp(j\pi B/L)\exp(-j\pi(2k+0.5)(2Ln+B)/(2M))\}$$

$$w3(n) = \text{Re}\{(1/M) \sum_{k=0}^{M/(2L)-1} X(2k, mM/K)\exp(j\pi(2k+0.5)(2Ln+B)/(2M))\} +$$

$$\text{Re}\{(1/M) \sum_{k=M/(2L)}^{M/L-1} X(2M/L-1-2k, mM/K)\exp(j\pi(2M/L-2k-0.5)(2Ln+B)/(2M))\}$$

$$w3(n) = \text{Re}\{(1/M) \sum_{k=0}^{M/(2L)-1} X(2k, mM/K)\exp(j\pi(2k+0.5)(2Ln+B)/(2M))\} + \text{Re}\{(1/M) \sum_{k=0}^{M/(2L)-1} X(2k+1, mM/K)\exp(j\pi(2k+1+0.5)(2Ln+B)/(2M))\}$$

$$w3(n) = \text{Re}\{(1/M) \sum_{k=0}^{M/L-1} X(k, mM/K)\exp(j\pi(k+0.5)(2Ln+B)/(2M))\}$$

A final formula of (Formula 49) is coincident with such a formula that w is substituted for w3 in (formula 9) and a range of a value of n is set to 0≦n≦M/L−1.

In the same manner, if (formula 48) is substituted for a lower formula of (formula 44) to transform the formula, (formula 50) is realized.

$$w3(n+M/L)) = \text{Im}\{w2(n)(1/M)\exp(-j\pi(2Ln+B)/(4M))\} \quad \text{(formula 50)}$$

$$w3(n+M/L) = \text{Re}\{(-j)w2(n)(1/M)\exp(-j\pi(2Ln+B)/(4M))\}$$

$$w3(n+M/L) = \text{Re}\{(-j)(1/M) \sum_{k=0}^{M/(2L)-1} X^*(2k, mM/K)\exp(-j\pi(2k+0.5)(2Ln+B)/(2M))\} +$$

$$\text{Re}\{(-j)(1/M) \sum_{k=M/(2L)}^{M/L-1} X(2M/L-1-2k, mM/K)\exp(j\pi B/L)\exp(-j\pi(2k+0.5)(2Ln+B)/(2M))\}$$

$$w3(n+M/L) = \text{Re}\{j(1/M) \sum_{k=0}^{M/(2L)-1} X(2k, mM/K)\exp(j\pi(2k+0.5)(2Ln+B)/(2M))\} + \text{Re}\{(-j)(1/M) \sum_{k=M/(2L)}^{M/L-1} X(2M/L-1-2k, mM/K)\exp(j\pi(2M/L-2k-0.5)(2Ln+B)/(2M))\}$$

$$w3(n+M/L) = \text{Re}\{j(1/M) \sum_{k=0}^{M/(2L)-1} X(2k, mM/K)\exp(j\pi(2k+0.5)(2Ln+B)/(2M))\} +$$

$$\text{Re}\{(-j)(1-M) \sum_{k=0}^{M/(2L)-1} X(2k+1, mM/K)\exp(j\pi(2k+1+0.5)(2Ln+B)/(2M))\}$$

-continued $$w3(n+M/L) = \text{Re}\{(1/M)\sum_{k=0}^{M/(2L)-1} X(2k, mM/$$

$$K)\exp(j\pi(2k+0.5)(2L(n+M/L)+B)/(2M))\} +$$

$$\text{Re}\{(1/M)\sum_{k=0}^{M/(2L)-1} X(2k+1, mM/K)\exp(j\pi(2k+$$

$$1+0.5)(2L(n+M/L)+B)/(2M))\}$$

$$w3(n+M/L) = \text{Re}\{(1/M)\sum_{k=0}^{M/L-1} X(k, mM/$$

$$K)\exp(j\pi(k+0.5)(2L(n+M/L)+B)/(2M))\}$$

A final formula of (Formula 50) is coincident with such a formula that a range of a value of n is set to M/L≦1≦2M/L−1 and n is set to n+M/L, and w is substituted for w3 in (formula 9). Therefore, embodiment 5 can work out an identical result to the conventional example of FIG. 14.

Figure 7:
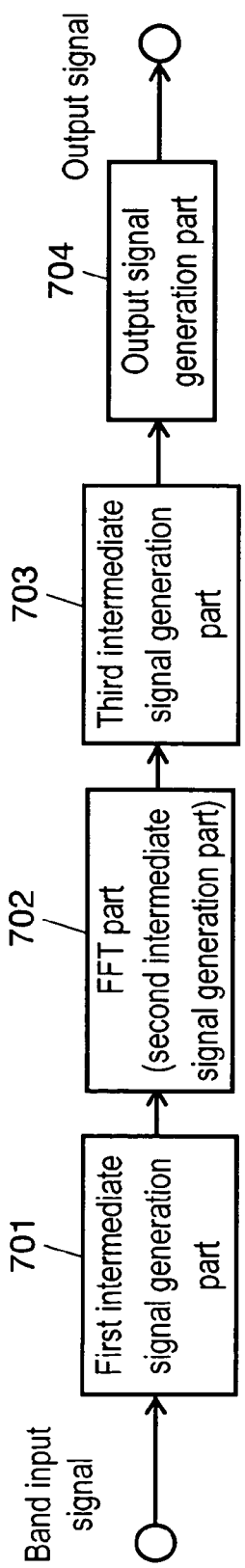
FIG. 7 is a block diagram which shows a configuration of a device for carrying out the signal synthesizing method of the complex exponential modulation filter bank in embodiment 5 of the invention.

FIG. 7 is a block diagram of a device which executes the signal synthesizing method of the complex exponential modulation filter bank of embodiment 5. In FIG. 7, a first intermediate signal generation part outputs a first intermediate signal by executing (formula 40) and (formula 41) from a complex band input signal. FFT part 702 outputs a second intermediate signal by executing (formula 43) with fast Fourier transform at M/L point to the first intermediate signal which was outputted from first intermediate signal generation part 701. Third intermediate signal generation part 703 executes (formula 44) from the second intermediate signal which was outputted from FFT part 702, and outputs a third intermediate signal. In output signal generation part 704, an output signal is calculated by (formula 47) from the third intermediate signal which was outputted from third intermediate signal generation part 703 and filter coefficient of a prototype filter, and outputted.

As above, in the signal synthesizing method of the complex exponential modulation filter bank in embodiment 5, it is possible to reduce quantity of arithmetic operation necessary for execution of a complex exponential modulation signal synthesis filter bank, by effectively applying fast Fourier transform through the use of periodicity of a complex exponential function. By this, it is possible to reduce operation clock frequency at the time of implementing the complex exponential modulation signal synthesis filter bank in a digital signal processor and LSI, and it is possible to realize the complex exponential modulation signal synthesis filter bank with low electric power consumption. It is also possible to shorten processing time at the time of realizing the complex exponential modulation signal synthesis filter bank by software, using a computer, and it is possible to realize speeding-up of processing.

Meanwhile, in embodiment 5, constant number 1/M was multiplied in step 603, but this maybe modified in such a manner that it is multiplied in another step, e.g., in step 602.

Embodiment 6

Figure 8:
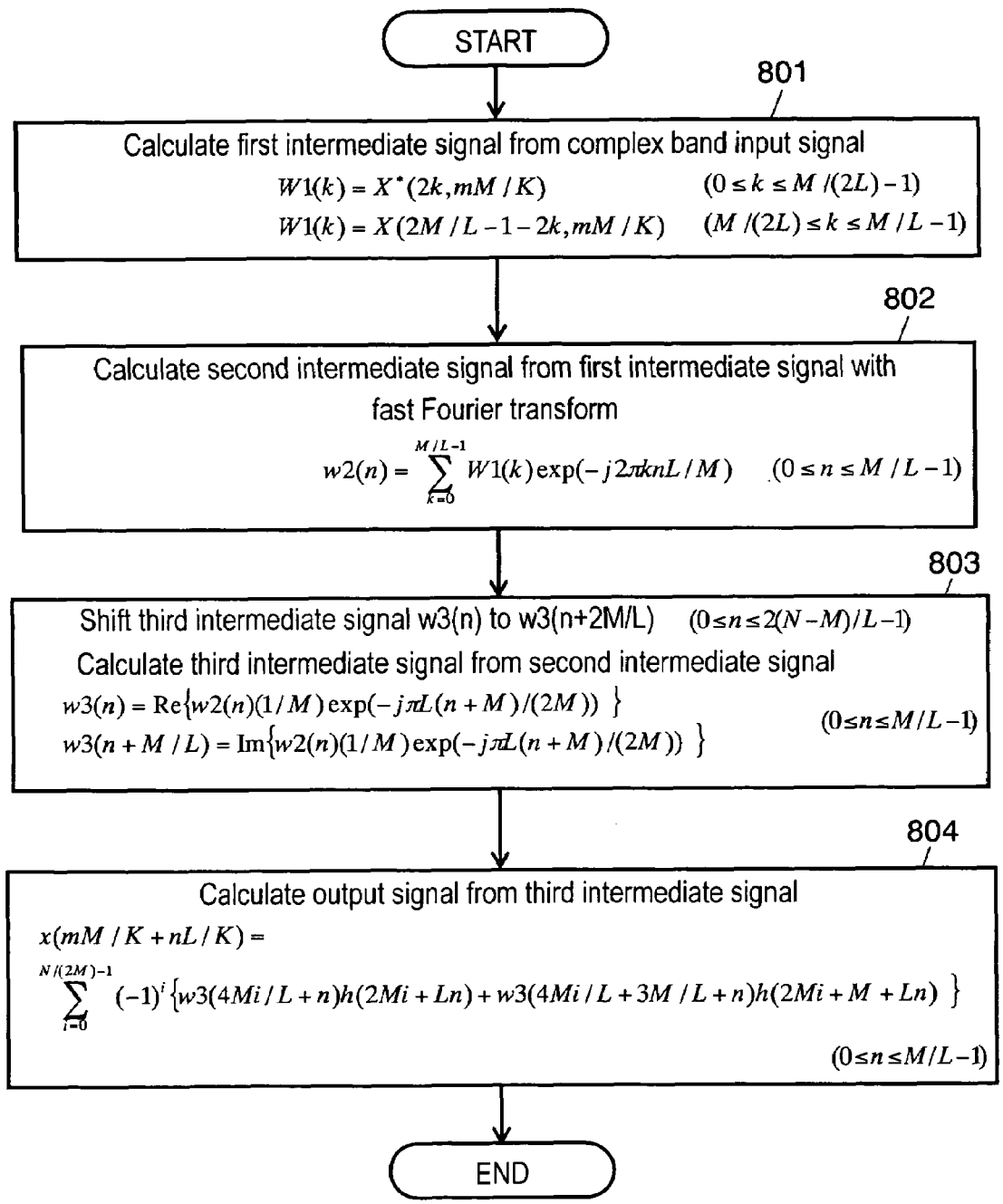
FIG. 8 is a flow chart which shows processing steps of a signal synthesizing method of a complex exponential modulation filter bank in embodiment 6 of the invention.

FIG. 8 is a flow chart which shows processing steps of a signal synthesizing method of a complex exponential modulation filter bank in embodiment 6 of the invention.

Embodiment 6 is of such a thing that phase B for signal synthesis was set up to ML in embodiment 5.

Steps 802 and 804 of FIG. 8 are identical to steps 602 and 604 of FIG. 6, and explanations will be omitted.

In step 801, a first intermediate signal is calculated from a complex band input signal. Assuming that a complex band input signal at sampling time mM/K in k-th band is set to X(k, mM/K), first intermediate signal W1(k) is calculated from the complex band input signal by (formula 51) of 0≦k≦M/(2L)−1, and calculated by (formula 52) of M/(2L)≦k≦M/L−1.

$$W1(k)=X^*(2k,mM/K) \; (0\leq k\leq M/(2L)-1) \quad \text{(formula 51)}$$

$$W1(k)=X(2M/L-1-2k,mM/K) \; (M/(2L)\leq k\leq M/L-1) \quad \text{(formula 52)}$$

In order to execute step 601 of FIG. 6 in embodiment 5, complex multiplication by M/L times is necessary, and real number addition by 2M/L times and real number multiplication by 4M/L times are necessary. However, complex multiplication is unnecessary in step 801, and quantity of arithmetic operation can be reduced by just that much.

In step 803, third intermediate signal w3(n) of 0≦n≦2(N−M)/L−1 is shifted to w3(n+2M/L), and then, third intermediate signals w3(n) and w3(n+M/L) of 0≦n≦M/L are calculated from the second intermediate signal by (formula 53).

$$w3(n)=Re\{w2(n)(1/M)\exp(-j\pi L(n+M)/(2M))\}$$

$$w3(n+M/L)=Im\{w2(n)(1/M)\exp(-j\pi L(n+M)/(2M))\}$$
$$(0\leq n\leq M/L-1) \quad \text{(formula 53)}$$

In step 803, assuming that (1/M)exp(−jπL(n+M)/(2M)) is stored in a table and used, in order to execute step 803, complex multiplication by M/L times is necessary, and if this is converted into real number operation, real number addition by 2M/L times and real number multiplication by 4M/L times are necessary. This number of arithmetic operation is identical to step 603 of FIG. 6.

Therefore, if the number of arithmetic operation necessary for executing embodiment 6 of FIG. 8 is calculated by summation of the number of arithmetic operation in the above-described each step, the number of real number addition is N/L+M/L+(3M/L)log$_2$(M/L) times, and the number of real number multiplication is N/L+4M/L+(2M/L)log$_2$(M/L) times. Assuming that order N of a prototype filter is 640, and number of bands M is 64, and scaling factor 1/L of down-sampling is 1, quantity of arithmetic operation necessary for executing embodiment 6 is of 1856 times as the number of real number addition, and 1664 times as the number of real number multiplication. Comparing this with embodiment 5, the number of real number addition is less by 128 times, and the number of real number multiplication is less by 256 times.

As above, in the signal synthesizing method of the complex exponential modulation filter bank in embodiment 6, it is possible to further reduce quantity of arithmetic operation as compared with embodiment 5, by setting up the phase for signal synthesis in such a manner that there occurs no multiplication in a step of calculating the first intermediate signal from the complex band input signal.

Embodiment 7

Figure 9:
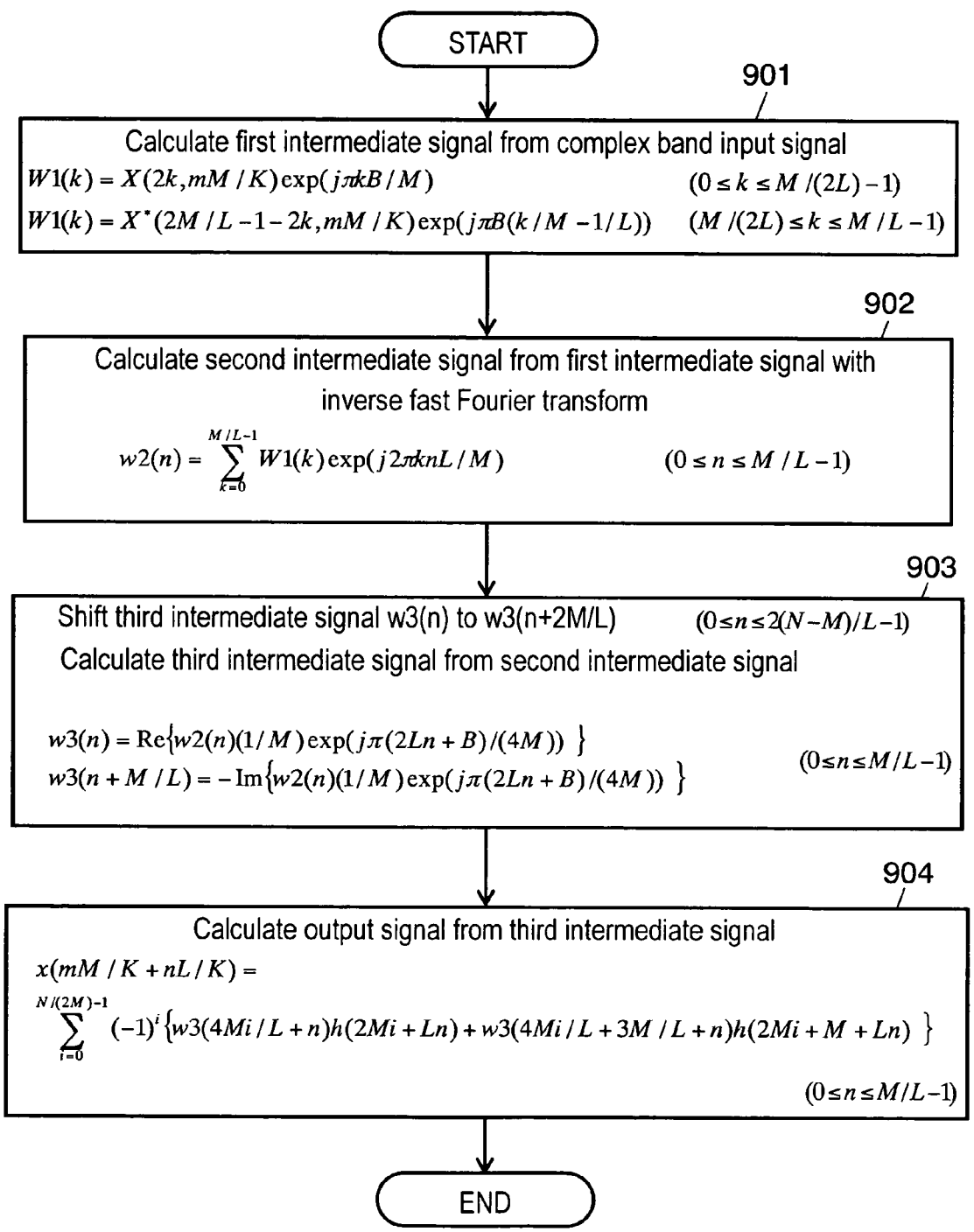
FIG. 9 is a flow chart which shows processing steps of a signal synthesizing method of a complex exponential modulation filter bank in embodiment 7 of the invention.

FIG. 9 is a flow chart which shows processing steps of a signal synthesizing method of a complex exponential modulation filter bank in embodiment 7 of the invention. In Embodiment 5, by effectively applying fast Fourier transform, quantity of arithmetic operation necessary for realizing a complex exponential modulation signal synthesis filter bank is reduced. In embodiment 7, by effectively applying inverse fast Fourier transform, quantity of arithmetic operation necessary for realizing a complex exponential modulation signal synthesis filter bank is reduced. In FIG. 9, step 904 is identical to step 604 of FIG. 6, and explanation will be omitted.

In step 901, a first intermediate signal is calculated from a complex band signal. Assuming that the complex band input signal at sampling time mM/K in k-th band is set to X(k, mM/K), first intermediate signal W1(k) is calculated from the complex band input signal by (formula 54) of $0 \leq k \leq M/(2L)-1$, and calculated by (formula 55) of $M/(2L) \leq k \leq M/L-1$. Here, B designates a phase for signal synthesis, and satisfies a relation formula of (formula 42) with phase A for signal analysis.

$$W1(k)=X(2k,mM/K)\exp(j\pi kB/M)\ (0 \leq k \leq M/(2L)-1) \quad \text{(formula 54)}$$

$$W1(k)=X^*(2M/L-1-2k,mM/K)\exp(j\pi B(k/M-1/L))$$
$$(M/(2L) \leq k \leq M/L-1) \quad \text{(formula 55)}$$

Assuming that $\exp(j\pi kB/M)$ and $\exp(j\pi B(k/M)-1/L)$ are stored in a table and used, in order to execute step 901, the number of complex multiplication by M/K times is necessary, and if this is converted into real number operation, the number of real number addition by 2M/L times, and the number of real number multiplication by 4M/L times are necessary.

In step 902, second intermediate signal $W2(n)(0 \leq n \leq M/L-1)$ is calculated from the first intermediate signal with inverse fast Fourier transform by (formula 56).

$$w2(n) = \sum_{k=0}^{M/L-1} W1(k)\exp(j2\pi knL/M) \quad \text{(formula 56)}$$
$$(0 \leq n \leq M/L-1)$$

In step 902, the number of real number addition necessary for executing IFFT at M/L point is $(3M/L)\log_2(M/L)$ times, and the number of real number multiplication is $(2M/L)\log_2(M/L)$ times.

In step 903, third intermediate signal w3(n) of $0 \leq n \leq 2(N-M)/L-1$ is shifted to w3(n+2M/L), and then, third intermediate signals w3(n) and w3(n+M/L) of $0 \leq n \leq M/L$ are calculated from the second intermediate signal by (formula 57).

$$w3(n)=Re\{w2(n)1/M)\exp(j\pi(2Ln+B)/(4M))\}$$

$$w3(n+M/L)=-Im\{w2(n)(1/M)\exp(j\pi(2Ln+B)/(4M))\}$$
$$(0 \leq n \leq M/L-1) \quad \text{(formula 57)}$$

In step 903, assuming that $(1/M)\exp(j\pi(2Ln+B)/(4M))$ is stored in a table and used, in order to execute step 903, complex multiplication by M/L times is necessary, and if this is converted into real number operation, real number addition by 2M/L times and real number multiplication by 4M/L times are necessary.

Therefore, if the number of arithmetic operation necessary for executing embodiment 7 of FIG. 9 is calculated by summation of the number of arithmetic operation in the above-described each step, the number of real number addition is $N/L+3M/L+(3M/L)\log_2(M/L)$ times, and the number of real number multiplication is $N/L+8M/L+(2M/L)\log_2(M/L)$ times. This is the same quantity of arithmetic operation as in embodiment 5. Assuming that order N of a prototype filter is 640, and number of bands M is 64, and scaling factor 1/L of down-sampling is 1, quantity of arithmetic operation necessary for executing embodiment 7 is of 1984 times as the number of real number addition, and 1920 times as the number of real number multiplication. Comparing this with the conventional example (16832 times as the number of real number addition, and 17024 times as the number of real number multiplication), it is possible in embodiment 7 to reduce both of the number of real number addition and the number of real number multiplication to ⅛ or less of the conventional example.

It is possible to explain that steps 901, 902 and 903 in embodiment 7 can output identical result to step 1401 in FIG. 14 of the conventional example, by substituting (formula 54) and (formula 55) for (formula 56) and by further substituting its substitution result for (formula 57), in the same manner as described in embodiment 5.

As above, in the signal synthesizing method of the complex exponential modulation filter bank in embodiment 7, it is possible to reduce quantity of arithmetic operation necessary for execution of a complex exponential modulation signal synthesis filter bank, by effectively applying inverse fast Fourier transform through the use of periodicity of a complex exponential function. By this, it is possible to reduce operation clock frequency at the time of implementing the complex exponential modulation signal synthesis filter bank in a digital signal processor and LSI, and it is possible to realize the complex exponential modulation signal synthesis filter bank with low electric power consumption. It is also possible to shorten processing time at the time of realizing the complex exponential modulation signal synthesis filter bank by software, using a computer, and it is possible to realize speeding-up of processing.

Embodiment 8

Figure 10:
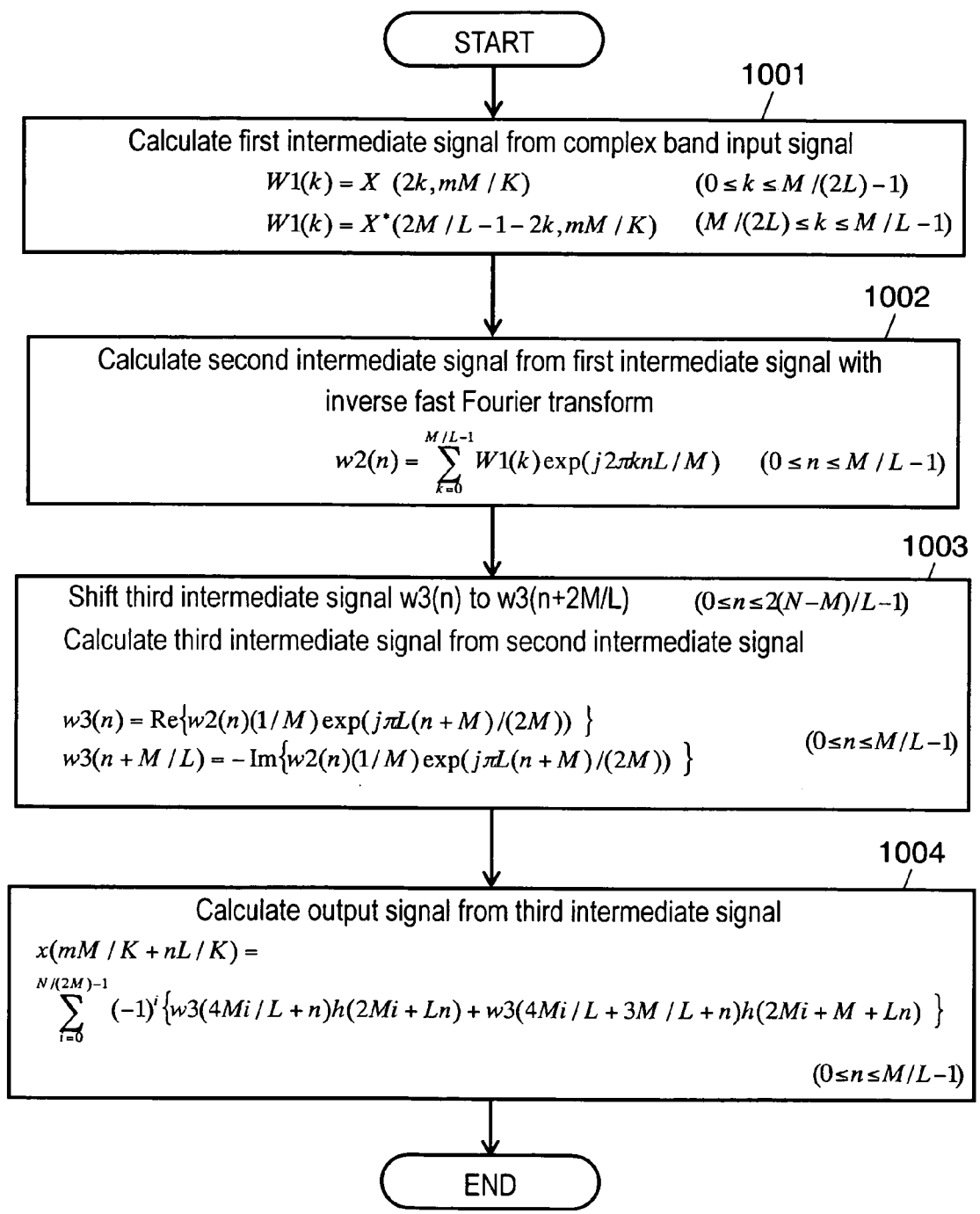
FIG. 10 is a flow chart which shows processing steps of a signal synthesizing method of a complex exponential modulation filter bank in embodiment 8 of the invention.

FIG. 10 is a flow chart which shows processing steps of a signal synthesizing method of a complex exponential modulation filter bank in embodiment 8 of the invention.

Embodiment 8 is of such a thing that phase B for signal synthesis was set up to ML in embodiment 7.

Steps 1002 and 1004 of FIG. 10 are identical to steps 902 and 904 of FIG. 9, respectively, and explanations will be omitted.

In step 1001, a first intermediate signal is calculated from a complex band input signal. Assuming that a complex band input signal at sampling time mM/K in k-th band is set to X(k, mM/K), first intermediate signal W1(k) is calculated from the complex band input signal by (formula 58) of $0 \leq k \leq M/(2L)-1$, and calculated by (formula 59) of $M/(2L) \leq k \leq M/L-1$.

$$W1(k)=X(2k,mM/K)\ (0 \leq k \leq M/(2L)-1) \quad \text{(formula 58)}$$

$$W1(k)=X^*(2M/L-1-2k,mM/K)\ (M/(2L) \leq k \leq M/L-1) \quad \text{(formula 59)}$$

In order to execute step 901 of FIG. 9, complex multiplication by M/L times is necessary, and real number addition by 2M/L times and real number multiplication by 4M/L times are necessary. However, in step 1001, complex multiplication is unnecessary, and quantity of arithmetic operation can be reduced by just that much.

In step 1003, third intermediate signal w3(n) of $0 \leq n \leq 2(N-M)/L-1$ is shifted to w3(n+2M/L), and then, third intermediate signals w3(n) and w3(n+M/L) of $0 \leq n \leq M/L$ are calculated from the second intermediate signal by (formula 60)

$$w3(n)=Re\{w2(n)(1/M)\exp(j\pi L(n+M)/(2M))\}$$

$$w3(n+M/L)=-Im\{w2(n)(1/M)\exp(j\pi L(n+M)/(2M))\}$$
$$(0 \leq n \leq M/L-1) \quad \text{(formula 60)}$$

In step 1003, assuming that $(1/M)\exp(j\pi L(n+M)/(2M))$ is stored in a table and used, in order to execute step 1003, complex multiplication by M/L times is necessary, and if this is converted into real number operation, real number addition by 2M/L times and real number multiplication by 4M/L times are necessary. This result of arithmetic operation is identical to step 903 of FIG. 9.

Therefore, if the number of arithmetic operation necessary for executing embodiment 8 of FIG. 10 is calculated by summation of the number of arithmetic operation in the above-described each step, the number of real number addition is N/L+M/L+(3M/L)log$_2$(M/L) times, and the number of real number multiplication is N/L+4M/L+(2M/L)log$_2$(M/L) times. Assuming that order N of a prototype filter is 640, and number of bands M is 64, and scaling factor 1/L of down-sampling is 1, quantity of arithmetic operation necessary for executing embodiment 8 is of 1856 times as the number of real number addition, and 1664 times as the number of real number multiplication. Comparing this with embodiment 7, the number of real number addition is less by 128 times, and the number of real number multiplication is less by 256 times.

As above, the signal synthesizing method of the complex exponential modulation filter bank of embodiment 8 sets up the phase for signal synthesis in such a manner that there occurs no multiplication in a step of calculating the first intermediate signal from the complex band input signal. By doing this, it is possible to further reduce quantity of arithmetic operation, as compared with embodiment 7.

Embodiment 9

Figure 11:
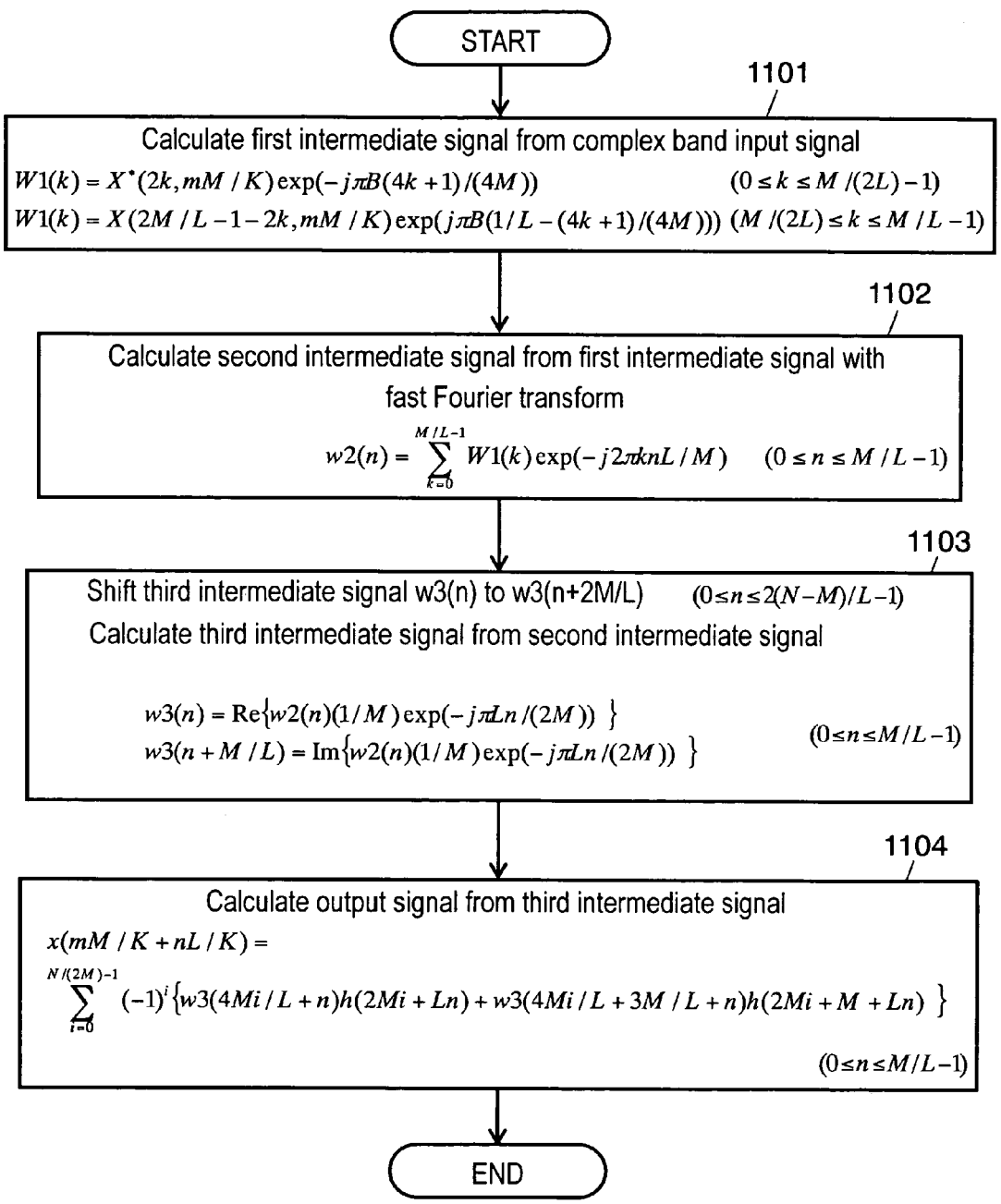
FIG. 11 is a flow chart which shows processing steps of a signal synthesizing method of a complex exponential modulation filter bank in embodiment 9 of the invention.
Figure 12:
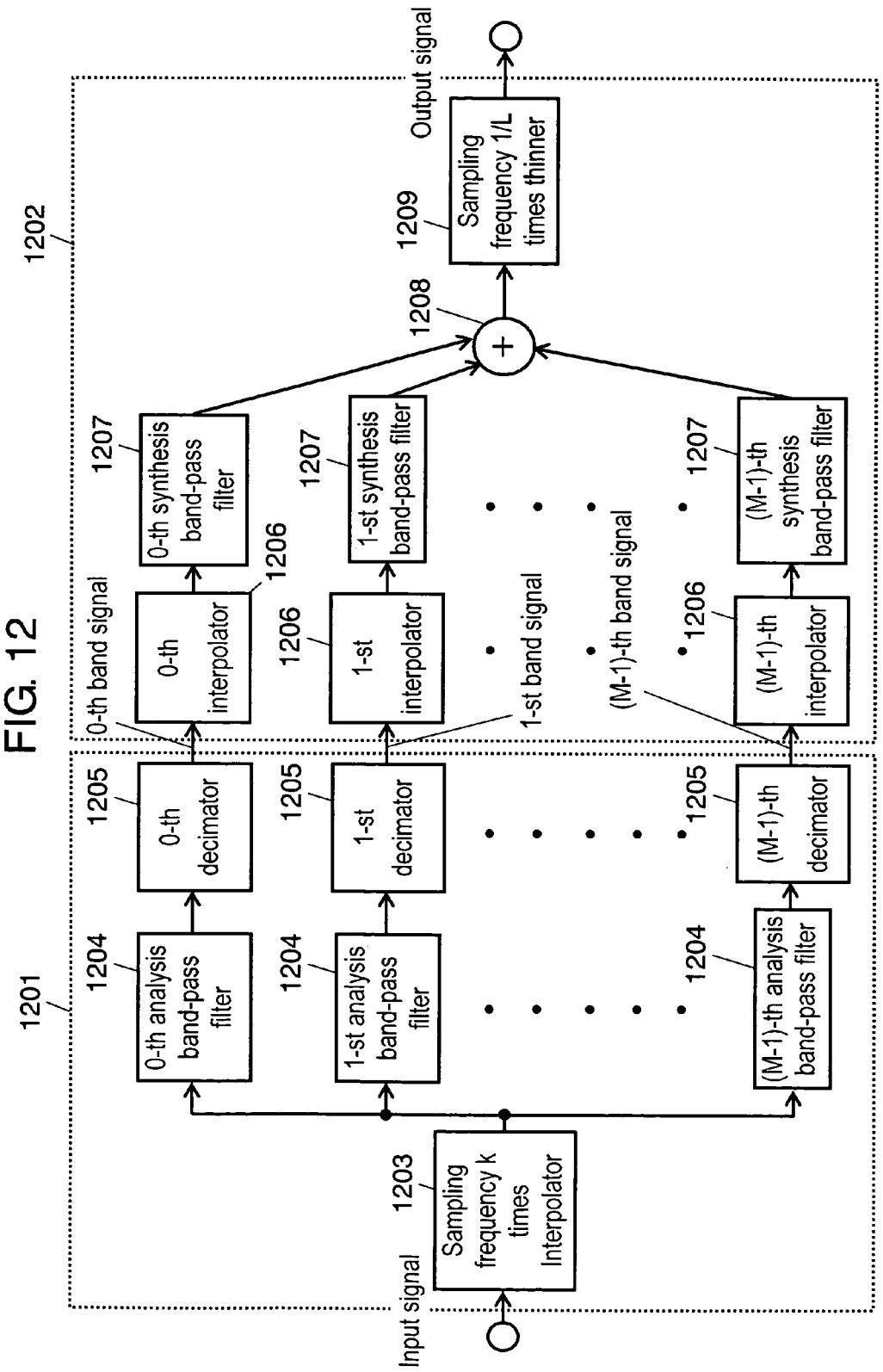
FIG. 12 is a block diagram which shows configurations of a signal analysis filter bank and a signal synthesis filter bank.

FIG. 11 is a flow chart which shows processing steps of a signal synthesizing method of a complex exponential modulation filter bank in embodiment 9 of the invention.

Steps 1102 and 1104 of FIG. 11 are identical to steps 602 and 604 of FIG. 6, respectively, and explanations will be omitted.

In step 1101, a first intermediate signal is calculated from a complex band input signal. Assuming that the complex band input signal at sampling time mM/K in k-th band is set to X(k, mM/K), first intermediate signal W1(k) is calculated from the complex band input signal by (formula 61) of 0≦k≦M/(2L)−1, and calculated by (formula 62) of M/(2L)≦k≦M/L−1.

$$W1(k)=X^*(2l,mM/K)\exp(-j\pi B(4k+1)/(4M))\ (0≦k≦M/(2L)-1) \quad \text{(formula 61)}$$

$$W1(k)=X(2M/L-1-2k,mM/K)\exp(j\pi B(1/L-(4k+1)/(4M)))\ (M/(2L)≦k≦M/L-1) \quad \text{(formula 62)}$$

By comparing (formula 61) and (formula 40) with (formula 62) and (formula 41), it is found out that step 1101 is of such a thing that exp(−jπB/(4M)) was multiplied with step 601.

In step 1103, third intermediate signal w3(n) of 0≦n≦2(N−M)/L−1 is shifted to w3(n+2M/L), and then, third intermediate signals w3(n) and w3(n+M/L) of 0≦n≦M/L are calculated from the second intermediate signal by (formula 63).

$$w3(n)=Re\{w2(n)(1/M)\exp(-j\pi Ln/(2M))\}$$

$$w3(n+M/L)=Im\{w2(n)(1/M)\exp(-j\pi Ln/(2M))\}\ (0≦n≦M/L-1) \quad \text{(formula 63)}$$

By comparing (formula 63) with (formula 44), it is found out that step 1103 is of such a thing that exp(jπB/(4M)) was multiplied with step 603.

Embodiment 9 of FIG. 11 is comparable to such a thing that constant number exp(−jπB/(4M)) was multiplied in step 601 of FIG. 6, and inverse number exp(jπB/(4M)) of the constant number was multiplied in step 603. If the constant number is multiplied in the former step, and the inverse number of the constant number is multiplied in the latter step, it is possible to obtain a result which is the same as original. Therefore, embodiment 9 of FIG. 11 can obtain an identical result to embodiment 5 of FIG. 6.

Meanwhile, in the above-described each embodiment, it may be all right even if the step is transformed in such a manner that a constant number is multiplied in a former step, and an inverse number of the constant number is multiplied in a latter step, in the same manner.

Meanwhile, the signal analyzing and signal synthesizing method in the above-described each embodiment can be realized as a program for having a computer or a digital signal processor execute it, and this may be recorded on a computer readable recording medium.

As above, a signal analyzing and signal synthesizing method of a complex exponential modulation filter bank which relates to the invention is useful as high efficiency coding of audio signals and image signals and a signal analyzing and signal synthesizing method for a digital equalizer etc., and in particular, suitable for realizing a complex exponential modulation filter bank with low electric power consumption or high speed, by reducing quantity of arithmetic operation.

What is claimed is:

1. A signal analyzing method of a complex exponential modulation filter bank, which makes K times sampling of an input signal with sampling frequency fs by K times (K is a divisor of number of bands M and a positive integer greater than or equal to 1), and divides it into M complex band signals with equal bandwidth and sampling frequency fsK/M to be outputted; comprising:

assuming that a filter coefficient of a linear phase non-recursive type prototype filter is set to h(n) (N is a filter order, 0≦n≦N), and values of first and last filter coefficients are set to zero, and an input signal at sampling time n is set to x(n), a step of calculating a first intermediate signal w1(n) from the input signal by (formula 1), where m is an integer;

$$w1(n) = \sum_{i=0}^{N/(2M)-1} (-1)^i x(mM/K - 2Mi/K - n) \quad \text{(formula 1)}$$

$$h(2Mi + Kn)$$

$$(0 \leq n \leq 2M/K - 1)$$

a step of calculating a second intermediate signal w2(n) from the first intermediate signal by (formula 2) (j is an imaginary unit);

$$w2(n)=(w1(n)-jw1(n+M/K))K\exp(-j\pi nK/(2M))$$

$$(0≦n≦M/K-1) \quad \text{(formula 2)}$$

a step of calculating a third intermediate signal W3(k) from the second intermediate signal by (formula 3) with fast Fourier transform; and $$W3(k) = \sum_{n=0}^{M/K-1} w2(n)\exp(-j2\pi knK/M) \quad \text{(formula 3)}$$

$$(0 \leq k \leq M/K - 1)$$

a step of calculating a complex band output signal X(k, mM/K) at sampling time mM/K in k-th band (0≦k≦M/K−1) from the third intermediate signal by (formula 4) (* is a conjugate complex number, and A is a phase for signal analysis) when k is an even number (k=2l), and by (formula 5) when k is an odd number (k=2l+1)

$X(2l,mM/K)=W3^*(l)\exp(j\pi(4l+1)A/(4M))$ $(0\leq l\leq M/(2K)-1)$ (formula 4)

$X(2l+1,mM/K)=W3(M/K-1-l)\exp(j\pi(4l+3)A/(4M))$ $(0\leq l\leq M/(2K)-1)$ (formula 5).

2. A signal analyzing method of a complex exponential modulation filter bank as set forth in claim 1, wherein the phase for signal analysis is set up in such a manner that there occurs no multiplication in a step of calculating the complex band output signal from the third intermediate signal.

3. A signal analyzing method of a complex exponential modulation filter bank, which makes K times sampling of an input signal with sampling frequency fs by K times (K is a divisor of number of bands M and a positive integer greater than or equal to 1), and divides it into M complex band signals with equal bandwidth and sampling frequency fsK/M to be outputted, comprising:

assuming that a filter coefficient of a linear phase non-recursive type prototype filter is set to h(n) (N is a filter order, $0\leq n\leq N$), and values of first and last filter coefficients are set to zero, and an input signal at sampling time n is set to x(n), a step of calculating a first intermediate signal w1(n) from the input signal by (formula 6), where m is an integer;

$$w1(n) = \sum_{i=0}^{N/(2M)-1} (-1)^i x(mM/K - 2Mi/K - n)h(2Mi + Kn)$$

$(0\leq n\leq 2M/K-1)$ (formula 6)

a step of calculating a second intermediate signal w2(n) from the first intermediate signal by (formula 7) (j is an imaginary unit);

$w2(n)=(w1(n)+jw1(n+M/K))K\exp(j\pi nK/(2M))$ $(0\leq n\leq M/K-1)$ (formula 7)

a step of calculating a third intermediate signal W3(k) from the second intermediate signal by (formula 8) with inverse fast Fourier transform; and $$W3(k) = \sum_{n=0}^{M/K-1} w2(n)\exp(j2\pi knK/M)$$

$(0\leq k\leq M/K-1)$ (formula 8)

a step of calculating a complex band output signal X(k, mM/K) at sampling time mM/K in k-th band ($0\leq k\leq M/K-1$) from the third intermediate signal by (formula 9) (A is a phase for signal analysis) when k is an even number (k=2l), and by (formula 10) (* is a conjugate complex number) when k is an odd number (k=2l+1)

$X(2l,mM/K)=W3(l)\exp(j\pi(4l+1)A/(4M))$ $(0\leq l\leq M/(2K)-1)$ (formula 9)

$X(2l+1,mM/K)=W3^*(M/K-1-l)\exp(j\pi(4l+3)A/(4M))$ $(0\leq l\leq M/(2K)-1)$ (formula 10).

4. A signal analyzing method of a complex exponential modulation filter bank as set forth in claim 3, wherein the phase for signal analysis is set up in such a manner that there occurs no multiplication in a step of calculating the complex band output signal from the third intermediate signal.

5. A signal synthesizing method of a complex exponential modulation filter bank, which synthesizes M complex band input signals with equal bandwidth and sampling frequency fsK/M (K is a divisor of number of bands M and a positive integer greater than or equal to 1), and makes 1/L times sampling of it (L is a divisor of N and a positive integer greater than or equal to 1), and outputs a signal with sampling frequency fsK/L, comprising:

assuming that a filter coefficient of a linear phase non-recursive type prototype filter is set to h(n) (N is a filter order, $0\leq n\leq N$), and values of first and last filter coefficients are set to zero, and a complex band input signal at sampling time mM/K in k-th band is set to X(k, mM/K), where m is an integer;

a step of calculating a first intermediate signal W1(k) from the complex band input signal by (formula 11) (j is an imaginary unit, * is a conjugate complex number, and B is a phase for signal synthesis) of $0\leq k\leq M/(2L)-1$, and by (formula 12) of $M/(2L)\leq k\leq M/L-1$;

$W1(k)=X^*(2k,mM/K)\exp(-j\pi kB/M)$ $(0\leq k\leq M/(2L)-1)$ (formula 11)

$W1(k)=X(2M/L-1-2k,mM/K)\exp(j\pi B(1/L-k/M))$ $(M/(2L)\leq k\leq M/L-1)$ (formula 12)

a step of calculating a second intermediate signal w2(n) from the first intermediate signal by (formula 13) with fast Fourier transform;

$$w2(n) = \sum_{k=0}^{M/L-1} W1(k)\exp(-j2\pi knL/M)$$

$(0\leq n\leq M/L-1)$ (formula 13)

a step of shifting a third intermediate signal w3(n) of $0\leq n\leq 2(N-M)/L-1$ to w3(n+2M/L), and calculating third intermediate signals w3(n) and w3(n+M/L) of $0\leq n\leq M/L$ from the second intermediate signal by (formula 14) (Re(x) is a real part of a complex number x, and Im(x) is an imaginary part of x); and $w3(n)=Re\{w2(n)(1/M)\exp(-j\pi(2Ln+B)/(4M))\}$ $w3(n+M/L)=Im\{w2(n)(1/M)\exp(-j\pi(2Ln+B)/(4M))\}$ $(0\leq n\leq M/L-1)$ (formula 14)

a step of calculating an output signal x(mM/K+nL/K) at sampling time mM/K+nL/K ($0\leq n\leq N/L-1$) from the third intermediate signal by (formula 15)

$$x(mM/K+nL/K) = \sum_{i=0}^{N/(2M)-1} (-1)^i \{w3(4Mi/L+n)h(2Mi+Ln) + w3(4Mi/L+3M/L+n)h(2Mi+M+Ln)\}.$$

(formula 15)

6. A signal synthesizing method of a complex exponential modulation filter bank as set forth in claim 5, wherein the phase for signal synthesis is set up in such a manner that there occurs no multiplication in a step of calculating the first intermediate signal from the complex band input signal.

7. A signal synthesizing method of a complex exponential modulation filter bank, which synthesizes N complex band input signals with equal bandwidth and sampling frequency fsK/N (K is a divisor of number of bands M and a positive integer greater than or equal to 1), and makes 1/L times sampling of it (L is a divisor of M and a positive integer greater than or equal to 1), and outputs a signal with sampling frequency fsK/L, comprising:

assuming that a filter coefficient of a linear phase non-recursive type prototype filter is set to h(n) (N is a filter order, $0 \leq n \leq N$), and values of first and last filter coefficients are set to zero, and a complex band input signal at sampling time mM/K in k-th band is set to X(k, mN/K), where m is an integer;

a step of calculating a first intermediate signal W1(k) from the complex band input signal by (formula 16) (j is an imaginary unit, and B is a phase for signal synthesis) of $0 \leq k \leq M/(2L)-1$, and by (formula 17) (* is a conjugate complex number) of $M/(2L) \leq k \leq M/L-1$;

$$W1(k)=X(2k,mM/K)\exp(j\pi kB/M) \ (0 \leq k \leq M/(2L)-1) \quad \text{(formula 16)}$$

$$W1(k)=X^*(2M/L-1-2k,mM/K)\exp(j\pi B(k/M-1/L)) \\ (M/(2L) \leq k \leq M/L-1) \quad \text{(formula 17)}$$

a step of calculating a second intermediate signal w2(n) from the first intermediate signal by (formula 18) with inverse fast Fourier transform;

$$w2(n) = \sum_{k=0}^{M/L-1} W1(k)\exp(j2\pi knL/M) \quad \text{(formula 18)}$$

$$(0 \leq n \leq M/L - 1)$$

a step of shifting a third intermediate signal w3(n) of $0 \leq n \leq 2(N-M)/L-1$, to w3(n+2M/L), and calculating third intermediate signals w3(n) and w3(n+M/L) of $0 \leq n \leq M/L$ from the second intermediate signal by (formula 19) (Re(x) is an real part of a complex number x, and Im(x) is an imaginary part of x); and $$w3(n)=Re\{w2(n)(1/M)\exp(j\pi(2Ln+B)/(4M))\}$$

$$w3(n+M/L)=-Im\{w2(n)(1/M)\exp(j\pi(2Ln+B)/(4M))\} \\ (0 \leq n \leq M/L-1) \quad \text{(formula 19)}$$

a step of calculating an output signal x(mN/K+nL/K) at sampling time mN/K+nL/K ($0 \leq n \leq M/L-1$) from the third intermediate signal by (formula 20)

$$x(mM/K + nL/K) = \quad \text{(formula 20)}$$

$$\sum_{i=0}^{N/(2M)-1} (-1)^i\{w3(4Mi/L + n)h(2Mi + Ln) +$$

$$w3(4Mi/L + 3M/L + n)h(2Mi + M + Ln)\}.$$

8. A signal synthesizing method of a complex exponential modulation filter bank as set forth in claim 7, wherein the phase for signal synthesis is set up in such a manner that there occurs no multiplication in a step of calculating the first intermediate signal from the complex band input signal.

9. A computer readable recording medium in which is recorded a program for having a computer or a digital signal processor execute a signal analyzing method of a complex exponential modulation filter bank, which makes K times sampling of an input signal with sampling frequency fs by K times (K is a divisor of number of bands N and a positive integer greater than or equal to 1), and divides it into M complex band signals with equal bandwidth and sampling frequency fsK/M to be outputted, comprising:

assuming that a filter coefficient of a linear phase non-recursive type prototype filter is set to h(n) (N is a filter order, $0 \leq n \leq N$), and values of first and last filter coefficients are set to zero, and an input signal at sampling time n is set to x(n), a step of calculating a first intermediate signal w1(n) from the input signal by (formula 1), where m is an integer;

$$w1(n) = \sum_{i=0}^{N/(2M)-1} (-1)^i x(mM/K - 2Mi/K - n)h(2Mi + Kn) \quad \text{(formula 1)}$$

$$(0 \leq n \leq 2M/K - 1)$$

a step of calculating a second intermediate signal w2(n) from the first intermediate signal by (formula 2) (j is an imaginary unit);

$$w2(n)=(w1(n)-jw1(n+M/K))K\exp(-j\pi nK/(2M)) \\ (0 \leq n \leq M/K-1) \quad \text{(formula 2)}$$

a step of calculating a third intermediate signal W3(k) from the second intermediate signal by (formula 3) with fast Fourier transform; and $$W3(k) = \sum_{n=0}^{M/K-1} w2(n)\exp(-j2\pi knK/M) \quad \text{(formula 3)}$$

$$(0 \leq k \leq M/K - 1)$$

a step of calculating a complex band output signal X(k, mM/K) at sampling time mM/K in k-th band ($0 \leq k \leq M/K-1$) from the third intermediate signal by (formula 4) (* is a conjugate complex number, and A is a phase for signal analysis) when k is an even number (k=2l), and by (formula 5) when k is an odd number (k=2+l)

$$X(2l,mM/K)=W3^*(l)\exp(j\pi(4l+1)A/(4M)) \ (0 \leq l \leq M/ \\ (2K)-1) \quad \text{(formula 4)}$$

$$X(2l+1,mM/K)=W3(M/K-1-l)\exp(j\pi(4l+3)A/(4M)) \\ (0 \leq l \leq M/(2K)-1) \quad \text{(formula 5)}.$$

10. A computer readable recording medium in which is recorded a program for having a computer or a digital signal processor execute a signal analyzing method of a complex exponential modulation filter bank, which makes K times sampling of an input signal with sampling frequency fs by K times (K is a divisor of number of bands M and a positive integer greater than or equal to 1), and divides it into M complex band signals with equal bandwidth and sampling frequency fsK/M to be outputted, comprising:

assuming that a filter coefficient of a linear phase non-recursive type prototype filter is set to h(n) (N is a filter order, $0 \leq n \leq N$), and values of first and last filter coefficients are set to zero, and an input signal at sampling time n is set to x(n), a step of calculating a first intermediate signal w1(n) from the input signal by (formula 6), where m is an integer;

$$w1(n) = \sum_{i=0}^{N/(2M)-1} (-1)^i x(mM/K - 2Mi/K - n)h(2Mi + Kn) \quad \text{(formula 6)}$$

$$(0 \leq n \leq 2M/K - 1)$$

a step of calculating a second intermediate signal w2(n) from the first intermediate signal by (formula 7) (j is an imaginary unit);

$$w2(n) = (w1(n) + jw1(n+M/K))K \exp(j\pi nK/(2M))$$
$$(0 \leq n \leq M/K - 1) \quad \text{(formula 7)}$$

a step of calculating a third intermediate signal W3(k) from the second intermediate signal by (formula 8) with inverse fast Fourier transform; and $$W3(k) = \sum_{n=0}^{M/K-1} w2(n)\exp(j2\pi knK/M) \quad \text{(formula 8)}$$

$$(0 \leq k \leq M/K - 1)$$

a step of calculating a complex band output signal X(k, mM/K) at sampling time mM/K in k-th band (0≤k≤M/K−1) from the third intermediate signal by (formula 9) (A is a phase for signal analysis) when k is an even number (k=2l), and by (formula 10) (* is a conjugate complex number) when k is an odd number (k=2l+1)

$$X(2l, mM/K) = W3(l)\exp(j\pi(4l+1)A/(4M)) \ (0 \leq l \leq M/(2K)-1) \quad \text{(formula 9)}$$

$$X(2l+1, mM/K) = W3^*(M/K-1-l)\exp(j\pi(4l+3)A/(4M))$$
$$(0 \leq l \leq M/(2K)-1) \quad \text{(formula 10)}.$$

11. A computer readable recording medium in which a program for having a computer or a digital signal processor execute a signal synthesizing method of a complex exponential modulation filter bank, which synthesizes M complex band input signals with equal bandwidth and sampling frequency fsK/M (K is a divisor of number of bands M and a positive integer greater than or equal to 1), and makes 1/L times sampling of it (L is a divisor of M and a positive integer greater than or equal to 1), and outputs a signal with sampling frequency fsK/L, comprising:

assuming that a filter coefficient of a linear phase non-recursive type prototype filter is set to h(n) (N is a filter order, 0≤n≤N), and values of first and last filter coefficients are set to zero, and a complex band input signal at sampling time mM/K in k-th band is set to X(k, mM/K), where m is an integer;

a step of calculating a first intermediate signal W1(k) from the complex band input signal by (formula 11) (j is an imaginary unit, * is a conjugate complex number, and B is a phase for signal synthesis) of 0≤k≤M/(2L)−1, and by (formula 12) of M/(2L)≤k≤M/L−1;

$$W1(k) = X^*(2k, mM/K)\exp(-j\pi kB/M) \ (0 \leq k \leq M/(2L)-1) \quad \text{(formula 11)}$$

$$W1(k) = X(2M/L-1-2k, mM/K)\exp(j\pi(1/L-k/M)) \ (M/(2L) \leq k \leq M/L-1) \quad \text{(formula 12)}$$

a step of calculating a second intermediate signal w2(n) from the first intermediate signal by (formula 13) with fast Fourier transform;

$$w2(n) = \sum_{k=0}^{M/L-1} W1(k)\exp(-j2\pi knL/M) \quad \text{(formula 13)}$$

$$(0 \leq n \leq M/L - 1)$$

a step of shifting a third intermediate signal w3(n) of 0≤n≤2(N−M)/L−1 to w3(n+2M/L), and calculating third intermediate signals w3(n) and w3(n+M/L) of ≤n≤M/L from the second intermediate signal by (formula 14) (Re(x) is a real part of a complex number x, and Im(x) is an imaginary part of x); and $$w3(n) = Re\{w2(n)(1/M)\exp(-j\pi(2Ln+B)/(4M))\}$$

$$w3(n+M/L) = Im\{w2(n)(1/M)\exp(-j\pi(2Ln+B)/(4M))\}$$
$$(0 \leq n \leq M/L-1) \quad \text{(formula 14)}$$

a step of calculating an output signal x(mM/K+nL/K) at sampling time mM/K+nL/K (0≤n≤M/L−1) from the third intermediate signal by (formula 15)

$$x(mM/K + nL/K) = \quad \text{(formula 15)}$$
$$\sum_{i=0}^{N/(2M)-1} (-1)^i \{w3(4Mi/L+n)h(2Mi+Ln) +$$
$$w3(4Mi/L+3M/L+n)h(2Mi+M+Ln)\}.$$

12. A computer readable recording medium in which a program for having a computer or a digital signal processor execute a signal synthesizing method of a complex exponential modulation filter bank, which synthesizes M complex band input signals with equal bandwidth and sampling frequency fsK/M (K is a divisor of number of bands M and a positive integer greater than or equal to 1), and makes of it 1/L times sampling of it (L is a divisor of M and a positive integer greater than or equal to 1), and outputs a signal with sampling frequency fsK/L, comprising:

assuming that a filter coefficient of a linear phase non-recursive type prototype filter is set to h(n) (N is a filter order, 0≤n≤N), and values of first and last filter coefficients are set to zero, and a complex band input signal at sampling time mM/K in k-th band is set to X(k, mM/K), where m is an integer;

a step of calculating a first intermediate signal W1(k) from the complex band input signal by (formula 16) (j is an imaginary unit, and B is a phase for signal synthesis) of 0≤k≤M/(2L)−1, and by (formula 17) (* is a conjugate complex number) of M/(2L)≤k≤M/L−1:

$$W1(k) = X(2k, mM/K)\exp(j\pi kB/M) \ (0 \leq k \leq M/(2L)-1) \quad \text{(formula 16)}$$

$$W1(k) = X^*(2M/L-1-2k, mM/K)\exp(j\pi B(k/M-1/L))$$
$$(M/(2L) \leq k \leq M/L-1) \quad \text{(formula 17)}$$

a step of calculating a second intermediate signal w2(n) from the first intermediate signal by (formula 18) with inverse fast Fourier transform;

$$w2(n) = \sum_{k=0}^{M/L-1} W1(k)\exp(j2\pi knL/M) \quad \text{(formula 18)}$$

$$(0 \leq n \leq M/L - 1)$$

a step of shifting a third intermediate signal w3(n) of $0 \leq n \leq 2(N-M)/L-1$, to w3(n+2M/L), and calculating third intermediate signals w3(n) and w3(n+M/L) of $0 \leq n \leq M/L$ from the second intermediate signal by (formula 19) (Re(x) is an real part of a complex number x, and Im(x) is an imaginary part of x); and $w3(n)=Re\{w2(n)(1/M)\exp(j\pi(2Ln+B)/(4M))\}$ $w3(n+M/L)=-Im\{w2(n)(1/M)\exp(j\pi(2Ln+B)/(4M))\}$
$(0 \leq n \leq M/L-1)$ (formula 19)

a step of calculating an output signal x(mM/K+nL/K) at sampling time mM/K+nL/K ($0 \leq n \leq M/L-1$) from the third intermediate signal by (formula 20)

$$x(mM/K + nL/K) = \sum_{i=0}^{N/(2M)-1} (-1)^i \{w3(4Mi/L+n)h(2Mi+Ln) + w3(4Mi/L+3M/L+n)h(2Mi+M+Ln)\}. \quad \text{(formula 20)}$$

* * * * *

UNITED STATES PATENT AND TRADEMARK OFFICE
CERTIFICATE OF CORRECTION

PATENT NO. : 7,433,907 B2
APPLICATION NO. : 10/986624
DATED : October 7, 2008
INVENTOR(S) : Kiyotaka Nagai et al.

It is certified that error appears in the above-identified patent and that said Letters Patent is hereby corrected as shown below:

At Column 26, line 11, "divisor of N" should read --divisor of M--

At Column 26, line 52, "$0 \leq n \leq N/L-1$" should read --$0 \leq n \leq M/L-1$--

At Column 27, line 2, "synthesizes N complex" should read --synthesizes M complex--

At Column 27, line 4, "fsK/N" should read --fsK/M--

At Column 27, line 13, "(k, mN/K)" should read --(k, mM/K)--

At Column 27, line 45, "x(mN/K+nL/K)" should read --x(mM/K+nL/K)--

At Column 27, line 46, "mN/K+nL/K" should read --mM/K+nL/K--

At Column 28, line 1, "bands of N and a positive" should read --bands of M and a positive--

At Column 28, line 44, "(k=2+1)" should read --(k=21+1)--

At Column 30, line 11, "$\leq n \leq M/L$" should read --$0 \leq n \leq M/L$--

Signed and Sealed this

Third Day of March, 2009

JOHN DOLL
*Acting Director of the United States Patent and Trademark Office*